(12) United States Patent
Matsumoto

(10) Patent No.: US 12,127,339 B2
(45) Date of Patent: Oct. 22, 2024

(54) STRETCHABLE MOUNTING SUBSTRATE

(71) Applicant: Murata Manufacturing Co., Ltd., Nagaokakyo (JP)

(72) Inventor: Tadahiko Matsumoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 212 days.

(21) Appl. No.: 17/968,119

(22) Filed: Oct. 18, 2022

(65) Prior Publication Data

US 2023/0041066 A1 Feb. 9, 2023

Related U.S. Application Data

(63) Continuation of application No. PCT/JP2022/016140, filed on Mar. 30, 2022.

(30) Foreign Application Priority Data

Jun. 9, 2021 (JP) .................................. 2021-096860
Sep. 1, 2021 (JP) .................................. 2021-142492

(51) Int. Cl.
*H05K 1/00* (2006.01)
*H01R 12/52* (2011.01)
(Continued)

(52) U.S. Cl.
CPC ........... *H05K 1/0283* (2013.01); *H01R 12/52* (2013.01); *H05K 1/0306* (2013.01); *H05K 1/181* (2013.01)

(58) Field of Classification Search
CPC .... H05K 1/0283; H05K 1/0306; H05K 1/181; H01R 12/52
See application file for complete search history.

(56) References Cited

U.S. PATENT DOCUMENTS

2014/0218872 A1* 8/2014 Park ...................... H05K 1/0283
 216/13
2016/0295689 A1* 10/2016 Chang .................. H05K 1/0283
(Continued)

FOREIGN PATENT DOCUMENTS

| JP | H590982 U1 | 12/1993 |
| JP | 2014162124 A | 9/2014 |
| JP | 2018160575 A | 10/2018 |

OTHER PUBLICATIONS

International Search Report and Written Opinion in PCT/JP2022/016140, mailed Jun. 21, 2022, 7 pages.

*Primary Examiner* — Pete T Lee
(74) *Attorney, Agent, or Firm* — ArentFox Schiff LLP

(57) ABSTRACT

A stretchable mounting substrate that includes a first substrate including a stretchable base material and a stretchable wiring on the stretchable base material; a second substrate including a wiring for an electronic component, the second substrate overlapping at least a part of the first substrate in a plan view of the stretchable mounting substrate; and a connection member connecting the first substrate and the second substrate, the connection member including a connection base material and a connection wiring connecting the stretchable wiring of the first substrate and the wiring of the second substrate 20, wherein the connection member is configured to be deformed in accordance with an expansion/contraction direction of the first substrate so that an expansion/contraction ratio of a region of the first substrate overlapping the second substrate in the plan view is larger than an expansion/contraction ratio of the second substrate.

20 Claims, 15 Drawing Sheets

(51) Int. Cl.
*H05K 1/02* (2006.01)
*H05K 1/03* (2006.01)
*H05K 1/18* (2006.01)

(56) References Cited

U.S. PATENT DOCUMENTS

2018/0279467 A1    9/2018  Kamakura
2020/0037442 A1*  1/2020  Keum .................... H05K 1/147

* cited by examiner

STRETCHABLE MOUNTING SUBSTRATE

CROSS REFERENCE TO RELATED APPLICATIONS

The present application is a continuation of International application No. PCT/JP2022/016140, filed Mar. 30, 2022, which claims priority to Japanese Patent Application No. 2021-096860, filed Jun. 9, 2021, and Japanese Patent Application No. 2021-142492, filed Sep. 1, 2021, the entire contents of each of which are incorporated herein by reference.

FIELD OF THE INVENTION

The present invention relates to a stretchable mounting substrate.

BACKGROUND OF THE INVENTION

In recent years, there has been a demand for a device that is brought into contact with a living body to measure biological data. Examples of such a device include a device including a stretchable substrate and an electronic component mounted on the stretchable substrate. Such a device is also referred to as a stretchable substrate, and is disposed in close contact with a living body by expansion and contraction of the stretchable substrate, and can follow the operation of the living body.

For example, Patent Document 1 discloses that in a stretchable substrate including a base material (also referred to as a stretchable base material) made of a stretchable material and an island made of a material having a Young's modulus larger than that of the base material, the island is embedded in the base material to form an element (also referred to as an electronic component) on the island.

Patent Document 1: Japanese Patent Application Laid-Open No. 2014-162124

SUMMARY OF THE INVENTION

In the stretchable substrate as in Patent Document 1, when the stretchable substrate expands and contracts, a difference occurs in the expansion/contraction ratio of the stretchable substrate between a portion in which the island is embedded and a portion in which the island is not embedded. Specifically, the expansion/contraction ratio of the stretchable substrate is small in a portion in which an island made of a material having a Young's modulus larger than that of the base material is embedded, and the expansion/contraction ratio of the stretchable substrate is large in a portion in which an island is not embedded. When a portion having a small expansion/contraction ratio is present, such as a portion in which an island is embedded, a wearer may feel uncomfortable.

The present invention has been made to solve the above problem, and an object of the present invention is to provide a stretchable mounting substrate in which a portion having a small expansion/contraction ratio is less likely to occur.

A stretchable mounting substrate of the present invention includes: a first substrate including a stretchable base material and a stretchable wiring on the stretchable base material; a second substrate including a wiring for an electronic component, the second substrate overlapping at least a part of the first substrate in a plan view of the stretchable mounting substrate; and a connection member connecting the first substrate and the second substrate, the connection member including a connection base material and a connection wiring, and a connection wiring electrically connecting the stretchable wiring of the first substrate and the wiring of the second substrate, wherein the connection member is configured to be deformed in accordance with an expansion/contraction direction of the first substrate so that an expansion/contraction ratio of a region of the first substrate overlapping the second substrate in the plan view is larger than an expansion/contraction ratio of the second substrate.

According to the present invention, it is possible to provide a stretchable mounting substrate in which a portion having a small expansion/contraction ratio is less likely to occur.

DETAILED DESCRIPTION OF THE INVENTION

Hereinafter, a stretchable mounting substrate of the present invention will be described. The present invention is not limited to the following configurations, and may be modified as appropriate without departing from the gist of the present invention. Further, a combination of a plurality of individual preferable configurations described below is also the present invention.

Each embodiment described below is an example, and it goes without saying that partial replacement or combination of configurations described in different embodiments is possible. In the embodiments other than the first embodiment, description of matters common to the first embodiment will be omitted, and differences will be mainly described. In particular, the same operation and effect by the same configuration will not be sequentially mentioned for each embodiment.

[Stretchable Mounting Substrate]

First Embodiment

Figure 1:
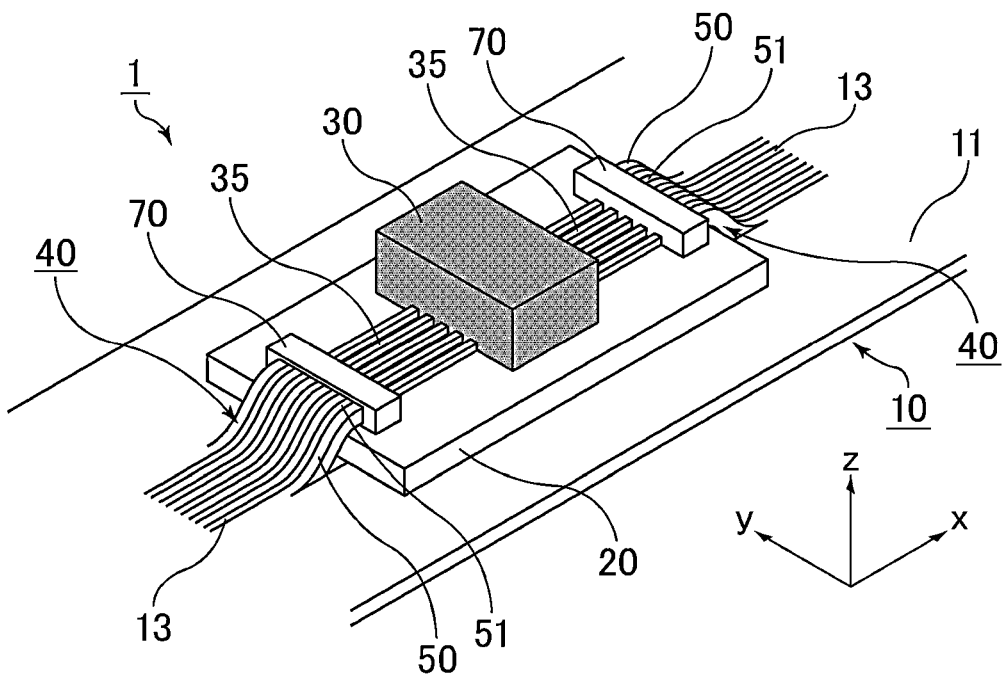
FIG. 1 is a perspective view schematically illustrating an example of a stretchable mounting substrate of a first embodiment of the present invention.
Figure 2:
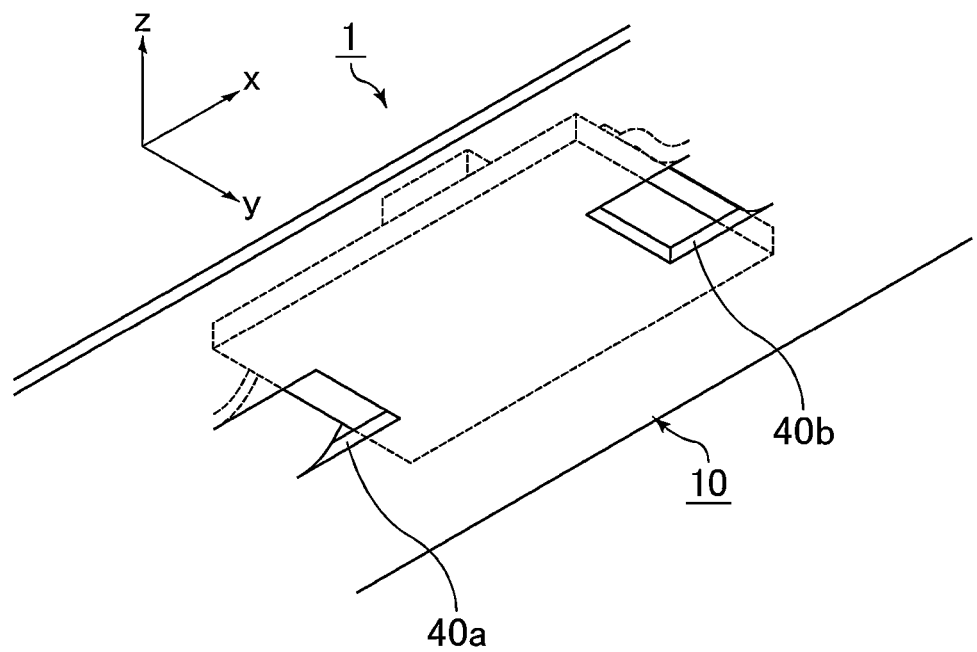
FIG. 2 is a lower perspective view in FIG. 1.
Figure 3:
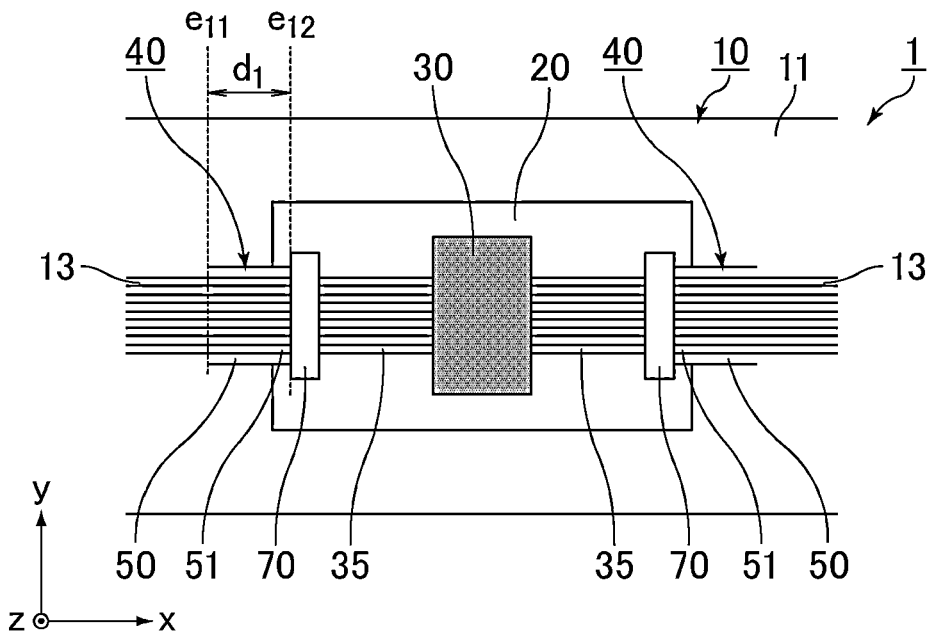
FIG. 3 is a plan view in FIG. 1.
Figure 4:
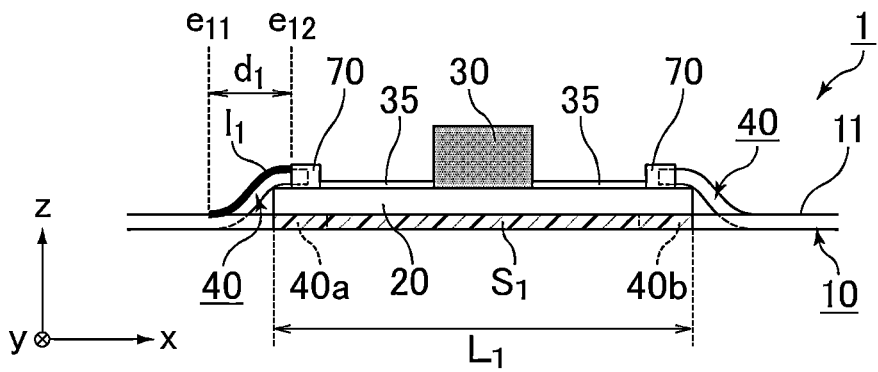
FIG. 4 is a side view in FIG. 1.

FIG. 1 is a perspective view schematically illustrating an example of a stretchable mounting substrate of a first embodiment of the present invention. FIG. 2 is a lower perspective view in FIG. 1. FIG. 3 is a plan view in FIG. 1. FIG. 4 is a side view in FIG. 1.

As illustrated in FIGS. 1, 2, 3, and 4, a stretchable mounting substrate 1 includes a first substrate 10, a second substrate 20, and connection members 40 that physically connect the first substrate 10 and the second substrate 20.

The first substrate 10 includes a stretchable base material 11 and a stretchable wiring 13 disposed on the stretchable base material 11.

The second substrate 20 has a rectangular plate shape in plan view arranged substantially parallel to the first substrate 10. The second substrate 20 has a main surface on the first substrate 10 side and a main surface on a side opposite to the first substrate 10.

An electronic component 30 is mounted on the main surface of the second substrate 20 on the side opposite to the first substrate 10.

Further, a wiring 35 and connection connectors 70 are provided on the second substrate 20.

The wiring 35 electrically connects the electronic component 30 mounted on the second substrate 20 and the connection connectors 70.

However, the position where the electronic component 30 is mounted is not limited to the main surface of the second substrate 20 on the side opposite to the first substrate 10.

That is, the electronic component 30 may be provided on the main surface of the second substrate 20 on the first substrate 10 side as long as expansion and contraction of the stretchable base material 11 is not hindered. In this case, the wiring 35 and the connection connectors 70 are also preferably provided on the main surface of the second substrate 20 on the first substrate 10 side.

As illustrated in FIG. 3, the first substrate 10 and the second substrate 20 have an overlapping portion in plan view. With the above configuration, the second substrate and the electronic component mounted on the second substrate are less likely to come into direct contact with the living body, so that the discomfort felt by a wearer can be reduced.

Preferably, the first substrate 10 and the second substrate 20 are not adhered to each other on the entire surface. When the first substrate 10 and the second substrate 20 are not adhered to each other on the entire surface, the expansion/contraction ratio of the region of the first substrate 10 overlapping the second substrate 20 in plan view is hardly affected by the expansion/contraction ratio of the second substrate 20.

Note that the first substrate 10 and the second substrate 20 may be in contact with each other or may be in contact with each other with a member made of a stretchable material interposed therebetween. As long as the first substrate 10 and the second substrate 20 are configured to be movable relative to each other, a part of the first substrate may be fixed to the second substrate with an adhesive or the like.

The connection member 40 physically connects the first substrate 10 and the second substrate 20.

Specifically, one end portion of the connection member 40 is connected to the first substrate 10, and the other end portion is connected to the connection connector 70 mounted on the second substrate 20.

The connection member 40 includes a connection base material 50 and a connection wiring 51.

One end portion of the connection wiring 51 is connected to the stretchable wiring 13 of the first substrate 10, and the other end portion is electrically connected to the wiring 35 of the second substrate 20 with the connection connector 70 interposed therebetween. Therefore, it can be said that the connection wiring 51 electrically connects the stretchable wiring 13 of the first substrate 10 and the wiring 35 of the second substrate 20. A boundary between the first substrate 10 and the connection member 40 is a position indicated by a broken line $e_{11}$, and a boundary between the connection member 40 and the connection connector 70 is a position indicated by a broken line $e_{12}$.

In addition, since the wiring 35 of the second substrate 20 is connected to the electronic component 30, it can be said that the connection wiring 51 electrically connects the stretchable wiring 13 of the first substrate 10 and the electronic component 30 mounted on the second substrate 20.

FIG. 4 illustrates a state where the first substrate does not expand and contract.

As illustrated in FIG. 4, in a state where the first substrate 10 does not expand and contract, a length (a length $l_1$ of the thick line portion in FIG. 4) of the connection member 40 in an expansion/contraction direction (x direction) measured along a surface of the connection member 40 is substantially the same as a shortest length (a length indicated by a double-headed arrow $d_1$ in FIG. 4) from an end portion (a position indicated by the broken line $e_{11}$) of the first substrate 10 to an end portion (a position indicated by the broken line $e_{12}$) of the second substrate 20 to be connected by the connection member 40 when the stretchable mounting substrate 1 is viewed in plan view. The length indicated by the double-headed arrow $d_1$ is also the length of the connection member 40 in plan view.

In a state where the first substrate 10 does not expand and contract, a region of the first substrate 10 overlapping the second substrate 20 in plan view is a region indicated by $S_1$. The length of the region $S_1$ in the longitudinal direction (x direction) is a length indicated by the double-headed arrow $L_1$.

Figure 5:
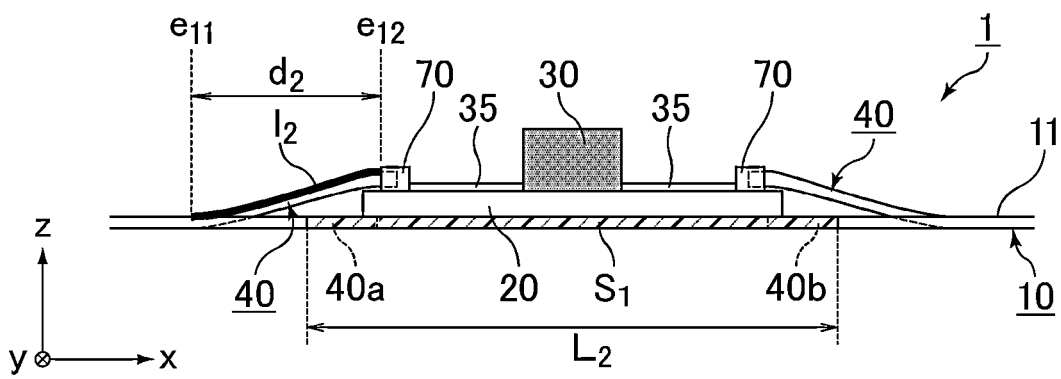
FIG. 5 is a view schematically illustrating an example in which the stretchable mounting substrate illustrated in FIG. 4 is modified.

FIG. 5 is a view schematically illustrating an example in which the stretchable mounting substrate illustrated in FIG. 4 is modified.

As illustrated in FIG. 5, when the stretchable mounting substrate 1 is stretched in the x direction, the first substrate 10 is stretched in the x direction, and the connection member 40 is also stretched in the x direction.

As illustrated in FIG. 5, after the stretchable mounting substrate 1 is stretched in the x direction, a length (a length $l_2$ of the thick line portion in FIG. 5) of the connection member 40 in the expansion/contraction direction (x direction) measured along the surface of the connection member 40 is substantially the same as a shortest length (a length indicated by a double-headed arrow $d_2$ in FIG. 5) from the end portion (the position indicated by the broken line $e_{11}$) of the first substrate 10 to the end portion (the position indicated by the broken line $e_{12}$) of the second substrate 20 to be connected by the connection member 40 when the stretchable mounting substrate 1 is viewed in plan view. This is because the connection member 40 is also stretched in the x direction in the same manner as the first substrate 10 is stretched in the x direction when the stretchable mounting substrate 1 is stretched in the x direction.

As illustrated in FIG. 5, since the length of the connection member 40 in the x direction changes from $l_1$ to $l_2$ when the stretchable mounting substrate 1 is stretched in the x direction, it can be said that the force of stretching the stretchable mounting substrate 1 in the x direction is used for deformation of the first substrate 10 and the connection member 40.

In a state where the first substrate 10 does not expand and contract, in the region $S_1$ of the first substrate 10 overlapping the second substrate in plan view, the length of the first substrate 10 in the longitudinal direction (x direction) changes from $l_1$ to $l_2$ by being stretched. That is, the expansion/contraction ratio of the region of the first substrate overlapping the second substrate when the first substrate expands and contracts is represented by $(l_2-L_1)/l_1$. From FIGS. 4 and 5, since $l_1<l_2$, the expansion/contraction ratio is larger than zero. On the other hand, since the force in the x direction is hardly applied to the second substrate 20, the dimension hardly changes. Therefore, the expansion/contraction ratio, which is a change in dimension of the second substrate, is a value close to zero.

As described above, in the stretchable mounting substrate 1, when the first substrate 10 expands and contracts, the connection member 40 is deformed in accordance with the expansion/contraction direction of the first substrate 10, so that expansion and contraction of the region of the first substrate 10 overlapping the second substrate in plan view is not restricted by the second substrate. Therefore, it can be said that the expansion/contraction ratio of the region of the first substrate 10 overlapping the second substrate in plan view is larger than the expansion/contraction ratio of the second substrate.

When the expansion/contraction ratio of the region of the first substrate 10 overlapping the second substrate 20 in plan view is larger than the expansion/contraction ratio of the second substrate 20, when the first substrate 10 expands and contracts, the region of the first substrate 10 overlapping the second substrate 20 in plan view is sufficiently deformed, so that a portion having a small expansion/contraction ratio is less likely to occur.

The expansion/contraction ratios of the first substrate and the second substrate can be obtained by setting the shortest distance from one end point to the other end point in a state where no force is applied to each member as a reference length, and dividing the shortest distance from the one end point to the other end point in a deformed state by the reference length.

Note that the expansion/contraction ratio of a region of the first substrate 10 overlapping the second substrate 20 in plan view refers to the expansion/contraction ratio of the first substrate 10 in the region. That is, when the first substrate includes the stretchable wiring in the region, the expansion/contraction ratio in a state where the stretchable base material and the stretchable wiring are included is used. On the other hand, when the first substrate does not include the stretchable wiring in the region, the expansion/contraction ratio of the stretchable base material in the region is used.

As shown in FIG. 4, in the stretchable mounting substrate of the first embodiment of the present invention, in a state where the first substrate does not expand and contract, the length of the connection member in the expansion/contraction direction measured along the surface of the connection member is preferably substantially the same as the shortest length from the end portion of the first substrate to the end portion of the second substrate to be connected by the connection member when the stretchable mounting substrate is viewed in the plan view.

When the length of the connection member in the expansion/contraction direction measured along the surface of the connection member in a state where the first substrate does not expand and contract is substantially the same as the shortest length from the end portion of the first substrate to the end portion of the second substrate to be connected by the connection member when the stretchable mounting substrate is viewed in the plan view, the connection member does not deflect in a state where the first substrate does not expand and contract, and the first substrate and the second substrate can be stably held.

In order to stretch the connection member 40 in the expansion/contraction direction as in the case where the first substrate 10 is stretched in the expansion/contraction direction, the Young's modulus of the connection member 40 in the expansion/contraction direction is preferably 110% or less of the Young's modulus of the first substrate 10 in the expansion/contraction direction.

When the Young's modulus of the connection member in the expansion/contraction direction is 110% or less of the Young's modulus of the first substrate in the expansion/contraction direction, it can be said that the connection member is deformed equivalent to the first substrate or easily deformed more than the first substrate. Therefore, when the first substrate expands and contracts, the connection member is easily deformed in accordance with the expansion/contraction direction of the first substrate.

That is, in the stretchable mounting substrate of the first embodiment of the present invention, preferably, the Young's modulus of the connection member in the expansion/contraction direction is 110% or less of the Young's modulus of the first substrate in the expansion/contraction direction, and the force applied to the portion where the second substrate and the connection member are connected by the expansion and contraction of the first substrate in the expansion/contraction direction is relaxed by the expansion and contraction of the connection member in the expansion/contraction direction.

In the stretchable mounting substrate of the first embodiment of the present invention, the material constituting the connection member and the material constituting the first substrate are preferably the same. Note that the material constituting the connection member and the material constituting the first substrate being the same means that the connection base material constituting the connection member and the stretchable base material constituting the first substrate are the same, and the connection wiring constituting the connection member and the stretchable wiring constituting the first substrate are the same.

When the material constituting the connection member and the material constituting the first substrate are the same, the Young's modulus of the connection member in the expansion/contraction direction is 90% to 110% of the Young's modulus of the first substrate in the expansion/contraction direction. When the Young's modulus of the connection member in the expansion/contraction direction is substantially the same as the Young's modulus of the first substrate in the expansion/contraction direction, a portion where the expansion/contraction ratio decreases is less likely to occur.

Examples of the case where the material constituting the connection member is the same as the material constituting the first substrate, and the Young's modulus of the connection member in the expansion/contraction direction and the Young's modulus of the first substrate in the expansion/contraction direction do not match include a case where the wiring density of the connection wiring constituting the connection member is different from the wiring density of the stretchable wiring constituting the first substrate.

In the stretchable mounting substrate of the first embodiment of the present invention, the connection member is preferably integral with the first substrate. The state where the connection member and the first substrate are integral means a state where not only the connection base material and the stretchable base material constituting the connection member are integral, but also the connection wiring and the stretchable wiring constituting the connection member are integral.

When the connection member is integral with the first substrate, the mechanical strength of the connection portion between the connection member and the first substrate increases. Furthermore, disconnection hardly occurs at a connection portion between the stretchable wiring and the connection wiring.

In the present specification, integration refers to a state where two or more kinds of members cannot be returned to a separated state without breakage. Examples of the integration include a case where a part of the same member is cut out and used as another member, and a case where two types of members are bonded by thermocompression bonding.

When a part of the first substrate is cut out to form a connection member, a portion that can be moved to a position not overlapping the flat surface to which the first substrate is fixed when the first substrate is fixed on the flat surface is defined as the connection member.

In the stretchable mounting substrate of the first embodiment of the present invention, the direction in which the connection member and the second substrate are aligned preferably coincides with the expansion/contraction direction of the first substrate.

In the stretchable mounting substrate 1 illustrated in FIGS. 1 to 5, the second substrate 20 and the two connection members 40 are aligned along the x direction. The expansion/contraction direction of the first substrate 10 is the x direction. Therefore, it can be said that the direction in which the second substrate 20 and the connection member 40 are aligned coincides with the expansion/contraction direction (x direction) of the first substrate 10.

In determining the direction in which the second substrate and the connection member are aligned, the center of gravity of the second substrate is compared with the center of gravity of the connection member, and the direction in which they are aligned is determined as the direction in which the second substrate and the connection member are aligned.

In the stretchable mounting substrate 1 illustrated in FIGS. 1 to 5, a part of the first substrate 10 is used as the connection member 40. Since a part of the first substrate 10 is used as the connection member 40, the connection base material 50 constituting the connection member 40 is integral with the stretchable base material 11, and the connection wiring 51 constituting the connection member 40 is integral with the stretchable wiring 13 disposed on the stretchable base material 11. Therefore, in the stretchable mounting substrate 1, it can be said that the connection member 40 and the first substrate 10 are integral.

Examples of a method of using a part of the first substrate 10 as the connection member 40 include a method of separating a portion to be the connection member 40 from the first substrate 10 and then bonding a necessary portion, and a method of leaving a part of a boundary between the portion to be the connection member 40 and the first substrate 10 without being separated. By leaving a part of the boundary between the portion to be the connection member 40 and the first substrate 10 without being separated, the boundary between the portion to be the connection member 40 and the first substrate 10 becomes a connection portion between the first substrate 10 and the connection member 40.

When a part of the first substrate 10 is cut out as the connection member 40, a gap 40a and a gap 40b are formed in the first substrate 10 as illustrated in FIG. 2.

As described above, when a part of the first substrate 10 is used as the connection member, the connection member does not overlap the first substrate in plan view. Therefore, in the stretchable mounting substrate of the present invention, the connection member preferably does not overlap the first substrate in plan view.

The connection base material and the stretchable base material may be different materials from each other.

In addition, the connection base material may be composed of a plurality of members, and the configuration and composition thereof may vary depending on the position. For example, the connection base material connected to the stretchable base material made of thermoplastic polyurethane (TPU) may have three portions of a portion close to the stretchable base material, a portion close to the connection connector, and an intermediate portion thereof. In this case, the portion of the connection base material close to the stretchable base material may be made of TPU, the portion of the connection base material close to the connection connector may be made of a material different from TPU (for example, the base material of the rigid substrate), and in the intermediate portion, the connection base material may be made of a laminate of TPU and a base material of a rigid substrate.

In the stretchable mounting substrate of the present invention, the second substrate is preferably physically connected to a plurality of connection members.

In the stretchable mounting substrate 1 illustrated in FIGS. 1 to 5, the second substrate 20 is physically connected to a plurality of (two) connection members 40.

When the second substrate is physically connected to the plurality of connection members, a force applied to the second substrate when the stretchable mounting substrate is deformed can be dispersed to the plurality of connection members, so that a change in the expansion/contraction ratio of the second substrate is reduced. Therefore, a portion having a small expansion/contraction ratio is less likely to occur in the stretchable mounting substrate.

The stretchable base material 11 is made of, for example, a stretchable resin material. Examples of the resin material include thermoplastic polyurethane, a silicone-based resin, an acrylic resin, an olefin-based resin, a urethane-based resin, and an elastomer-based resin.

The thickness of the stretchable base material 11 is not particularly limited, but is preferably 100 µm or less, and more preferably 1 µm or less, from the viewpoint of not hindering the expansion and contraction of the surface of the living body when the stretchable base material 11 is attached to the living body. In addition, the thickness of the stretchable base material 11 is preferably 0.1 µm or more.

The stretchable wiring preferably contains conductive particles and a resin. Examples thereof include a mixture of metal powders such as Ag, Cu, and Ni as conductive particles and an elastomer-based resin such as a silicone-based resin.

The average particle size of the conductive particles is not particularly limited, but is preferably 0.01 µm to 10 µm. The shape of the conductive particles is preferably spherical.

The thickness of the stretchable wiring is not particularly limited, but is preferably 100 µm or less, and more preferably 50 µm or less. In addition, the thickness of the stretchable wiring is preferably 0.01 µm or more.

The line width of the stretchable wiring is not particularly limited, but is preferably 0.1 µm to 10 mm.

The Young's modulus of the first substrate in the expansion/contraction direction is preferably 0.001 GPa to 1 GPa.

The Young's modulus of the first substrate in the expansion/contraction direction can be measured by a thermomechanical analysis (TMA) method.

An electrode in contact with the living body may be formed on the other main surface of the first substrate opposite to the one main surface on which the second substrate is provided.

When the electrode is formed on the other main surface of the first substrate, it is easy to acquire biological data as an electric signal.

An electronic component may be mounted on the first substrate. However, the electronic component mountable on the second substrate is preferably mounted on the second substrate.

Examples of the electronic component mounted on the first substrate include an acceleration sensor and a temperature sensor.

The electronic component mounted on the first substrate may be covered with a sealing resin or the like.

When the electronic component mounted on the first substrate is covered with a sealing resin or the like, deterioration of characteristics of the electronic component due to ingress of moisture into the electronic component can be prevented.

The second substrate may be a rigid substrate made of a glass epoxy substrate or the like, a flexible substrate, or a stretchable substrate. As the stretchable substrate, a stretchable base material constituting the first substrate can be used.

Even if the second substrate is a stretchable substrate, when a non-stretchable object such as a control box is mounted as an electronic component on the surface of the second substrate, the stretchability of the second substrate may not be exhibited. Even in such a case, when the second substrate is connected to the first substrate with the connection member interposed therebetween, a portion having a small expansion/contraction ratio is less likely to occur.

The thickness of the rigid substrate is preferably 0.2 mm to 2 mm.

The thickness of the flexible substrate is preferably 0.01 mm to 1 mm.

The thickness of the stretchable substrate is preferably 0.1 µm to 100 µm.

The second substrate may be a multilayer substrate. Wiring or electronic components may be provided on both surfaces of the second substrate.

The planar view area of the second substrate is not particularly limited, but is preferably 1 $cm^2$ to 400 $cm^2$.

When the planar view area of the second substrate is less than 1 $cm^2$, it may be difficult to mount necessary electronic components. On the other hand, when the planar view area of the second substrate exceeds 400 $cm^2$, the size of the second substrate is too large, and the followability when the second substrate is mounted on a living body may be deteriorated.

Examples of the electronic component mounted on the second substrate include an amplifier (operational amplifier, transistor, and the like), a chip capacitor, a chip resistor, and a microcomputer (MCU). The form for mounting the electronic component is not particularly limited, and the electronic component may be mounted as a bare chip, a ball grid array (BGA), a chip-scale package (CSP), a surface mount component (SMD), or the like. A plurality of electronic components may be mounted.

Examples of the material constituting the wiring provided on the second substrate include copper, silver, tin, nickel, gold, and alloys thereof. When the second substrate is a stretchable substrate, it is preferable to use the same wiring as the stretchable wiring constituting the first substrate as the wiring.

In the stretchable mounting substrate of the present invention, preferably, the second substrate further includes a connection connector, the connection connector is connected to an end of a wiring of the second substrate, and one end of the connection wiring of the connection member is electrically connected to the wiring of the second substrate by being fitted to the connection connector.

When the second substrate has the connection connector, it is possible to easily switch between a state where the first substrate and the second substrate are connected and a state where the connection is released by the connection member. When the connection is easily switched, the second substrate is easily replaced while the first substrate is in contact with the living body. In addition, while the first substrate in contact with the living body is separated and discarded, the second substrate not in contact with the living body is easily recovered and reused.

In the stretchable mounting substrate of the present invention, the connection connector is preferably a flexible flat cable connector.

The flexible flat cable (FFC) connector is lower in dimension in the height direction than a normal cable connector. Therefore, it is possible to contribute to the height reduction of the entire second substrate. In addition, since the FCC connector is harder than the stretchable base material, the FCC connector is less likely to be damaged by impact at the time of attachment and detachment, and has excellent durability.

In the stretchable mounting substrate of the present invention, preferably, the thickness of the connection member is thinner than the fitting thickness of the connection connector, and an auxiliary material for adjusting the thickness of the connection member to substantially the same thickness as the fitting thickness of the connection connector is disposed on one main surface of one end of the connection member in the thickness direction. However, the maximum thickness of the connection member may be larger than the fitting thickness of the connection connector.

The thickness required for the connection member from the viewpoint of securing the ease of deformation of the connection member may be thinner than the thickness required for the connection member from the viewpoint of securing the operability when the connection member is connected to the connection connector. Even in such a case, when the auxiliary material is disposed, it is possible to secure the connectivity between the connection member and the connection connector while securing the ease of deformation of the connection member.

The auxiliary material is preferably a glass epoxy substrate or a flexible substrate.

The auxiliary material composed of a glass epoxy substrate or a flexible substrate has high mechanical strength, and thus has excellent durability when the connection member and the connection connector are repeatedly connected. In addition, it is easy to adjust the thickness and shape of the auxiliary material composed of a glass epoxy substrate or a flexible substrate.

Figure 6:
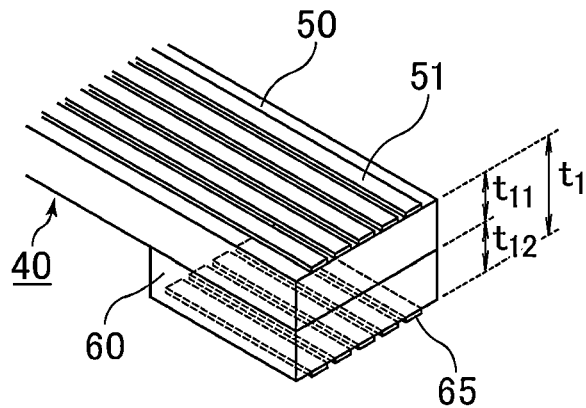
FIG. 6 is a perspective view schematically illustrating an example of an end of a connection member.
Figure 7:
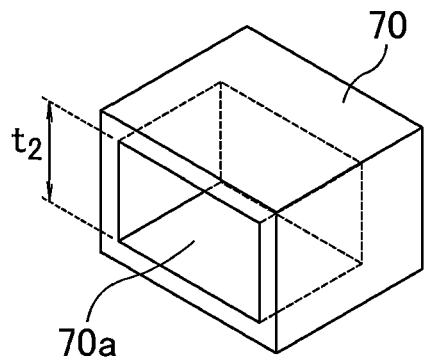
FIG. 7 is a perspective view schematically illustrating an example of a connection connector.

FIG. 6 is a perspective view schematically illustrating an example of an end of the connection member. FIG. 7 is a perspective view schematically illustrating an example of the connection connector.

As illustrated in FIG. 6, the connection wiring 51 is exposed on the connection base material 50 at the end of the connection member 40.

An auxiliary material 60 for adjusting the thickness of the connection member 40 is disposed on one main surface of one end of the connection member 40 in the thickness direction. The thickness of the connection member 40 itself is a thickness indicated by $t_{11}$, and the thickness of the auxiliary material 60 is a thickness indicated by $t_{12}$. Therefore, the thickness of the end of the connection member 40 is represented by a total thickness $t_1$ of $t_{11}$ and $t_{12}$. When the thickness $t_1$ of the end of the connection member 40 is equal to a thickness (fitting thickness) $t_2$ of a fitting portion 70a of the connection connector 70 illustrated in FIG. 7, the connection member 40 and the connection connector 70 can be fitted to each other. The shape of the connection connector is not limited to the shape illustrated in FIG. 7.

As illustrated in FIG. 6, the auxiliary material 60 includes an electrode 65 on a surface thereof, and the connection wiring 51 and the electrode 65 are electrically connected by a through conductor (not illustrated) penetrating the connection base material 50 and the auxiliary material 60 in the thickness direction.

Although a terminal electrically connected to the connection wiring 51 or the electrode 65 is provided in the fitting portion 70a of the connection connector 70, illustration thereof is omitted in FIG. 7.

Further, in the connection connector 70 illustrated in FIG. 6, the electrode 65 is provided on the surface of the auxiliary material 60, but the electrode may not be formed on the surface of the auxiliary material. In this case, the auxiliary material functions as a material for mechanically reinforcing the connection member.

In the stretchable mounting substrate shown in FIGS. 1 to 5, the connection connector 70 is configured such that the fitting portion opens in the horizontal direction (x direction), but the direction in which the fitting portion of the connection connector opens is not limited to the horizontal direction. Therefore, the direction in which the fitting portion of the connection member opens may be a direction (z direction) orthogonal to the surface on which the first substrate 10 and the second substrate 20 extend.

Although not illustrated in FIG. 7, the connection connector may be provided with a lock mechanism that fixes the connection member in a state of being fitted to the connection connector.

In the stretchable mounting substrate of the present invention, the first substrate may be attached to a living body, or the first substrate may be attached by being wound around an arm, a wrist, a neck, a trunk, a leg, or the like. When the stretchable mounting substrate of the present invention is attached to a living body, taping or the like may be used.

Second Embodiment

Figure 8:
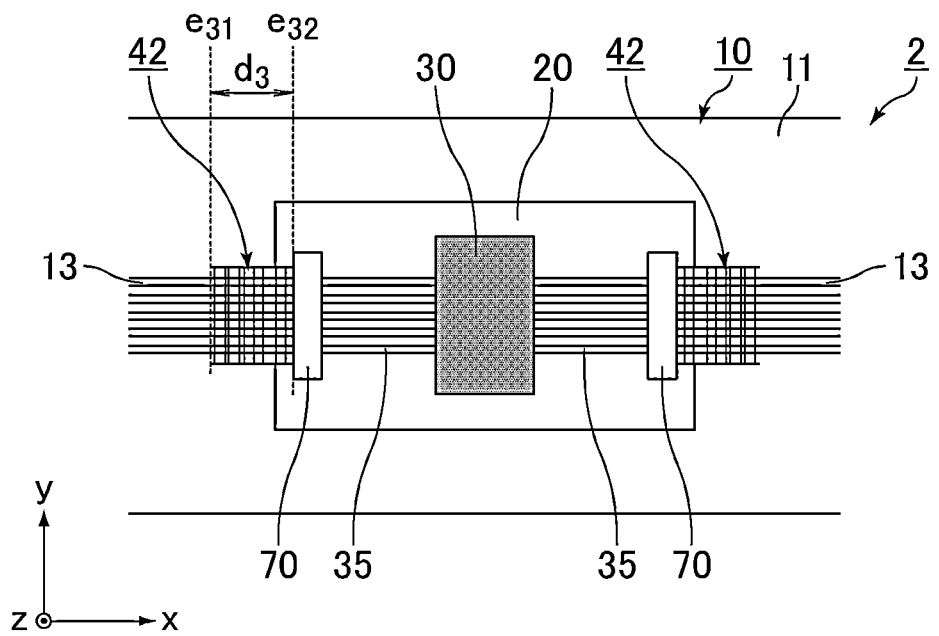
FIG. 8 is a plan view schematically illustrating an example of a stretchable mounting substrate of a second embodiment of the present invention.
Figure 9:
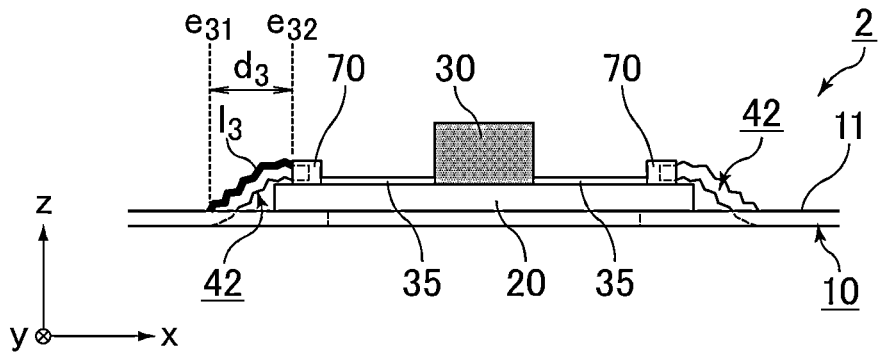
FIG. 9 is a side view in FIG. 8.
Figure 10:
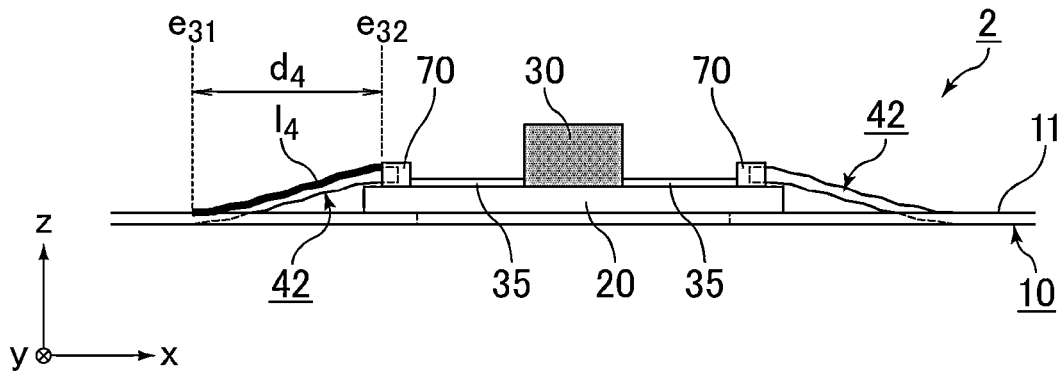
FIG. 10 is a view schematically illustrating an example in which the connection member is modified in FIG. 9.

FIG. 8 is a plan view schematically illustrating an example of a stretchable mounting substrate of a second embodiment of the present invention. FIG. 9 is a side view in FIG. 8. FIG. 10 is a view schematically illustrating an example in which the connection member is modified in FIG. 9.

The stretchable mounting substrate 2 illustrated in FIG. 8 is obtained by changing the configuration of the connection member 40 in the stretchable mounting substrate 1 illustrated in FIGS. 1 to 4. Specifically, in the stretchable mounting substrate 2 illustrated in FIG. 8, the connection member 42 connecting the first substrate 10 and the second substrate 20 has a bellows shape.

A boundary between the first substrate 10 and the connection member 42 is a position indicated by a broken line $e_{31}$, and a boundary between the connection member 42 and the connection connector 70 is a position indicated by a broken line $e_{32}$. Therefore, the length of the connection member 42 in plan view is represented by a double-headed arrow $d_3$.

As illustrated in FIG. 9, in a state where the first substrate 10 does not expand and contract, a length (a length $l_3$ indicated by a thick line in FIG. 9) of the connection member 42 in an expansion/contraction direction (x direction) measured along a surface of the connection member 42 is longer than a shortest length (a length indicated by the double-headed arrow $d_3$ in FIG. 9) from an end portion (a position indicated by a broken line $e_{31}$) of the first substrate 10 to an end portion (a position indicated by a broken line $e_{32}$) of the second substrate 20 to be connected by the connection member 42 when the stretchable mounting substrate 2 is viewed in the plan view, and the connection member 42 is deflected in the x direction.

The deflection amount is represented by a difference between the shortest length $d_3$ from the end portion of the first substrate to which the connection member is connected in the expansion/contraction direction to the end portion of the second substrate and the length $l_3$ of the connection member in the expansion/contraction direction measured along the surface of the connection member.

In a state where the first substrate does not expand and contract, a portion where the connection member is deflected is also referred to as a deflection portion. That is, the connection member may have a deflection portion. Note that the first substrate may have a deflection portion in an expanded and contracted state.

As illustrated in FIG. 10, when the first substrate 10 expands and contracts in the x direction, the bellows shape of the connection member 42 is stretched. At this time, when the stretchable mounting substrate 2 is viewed in the plan view, the shortest length (a length indicated by a double-headed arrow $d_4$ in FIG. 10) from the end portion (the position indicated by the broken line $e_{31}$) of the first substrate 10 to the end portion (the position indicated by the broken line $e_{32}$) of the second substrate 20 to be connected by the connection member 42 is longer than that in FIG. 9, and the deflection amount of the connection member 42 is changed. The length of the connection member 42 in the expansion/contraction direction (x direction) measured along the surface of the connection member 42 is the same in FIGS. 9 and 10. That is, a length (a length $l_4$ indicated by a thick line in FIG. 10) of the connection member 42 in the expansion/contraction direction (x direction) measured along the surface of the connection member 42 illustrated in FIG. 10 is the same as the length $l_3$ illustrated in FIG. 9.

From FIGS. 9 and 10, it can be said that in the stretchable mounting substrate 2, the force applied to the portion where the second substrate 20 and the connection member 42 are connected by the expansion and contraction of the first substrate 10 in the expansion/contraction direction (x direction) is relaxed by the change in the deflection amount of the connection member 42.

Third Embodiment

Figure 11:
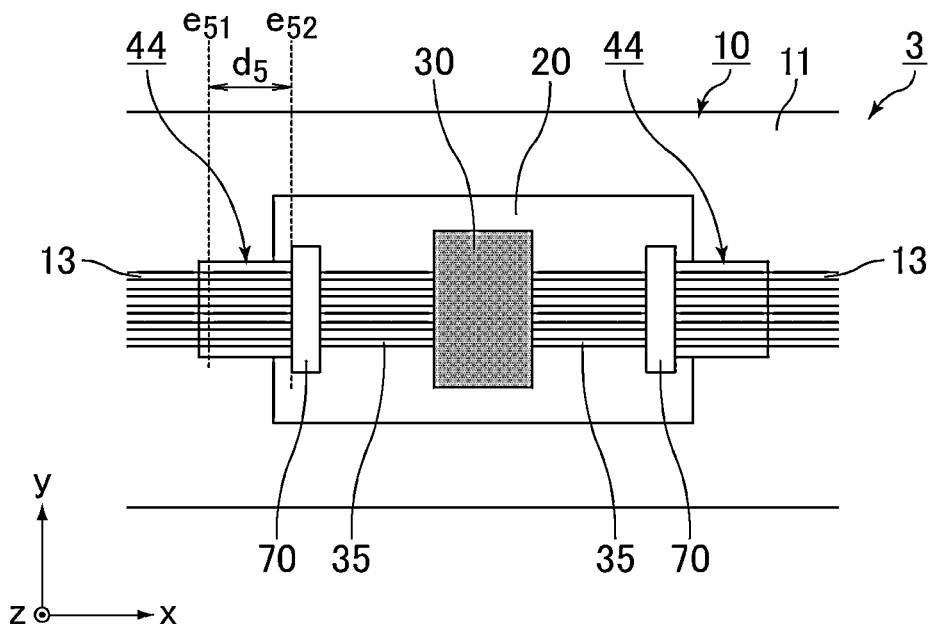
FIG. 11 is a plan view schematically illustrating an example of a stretchable mounting substrate of a third embodiment of the present invention.
Figure 12:
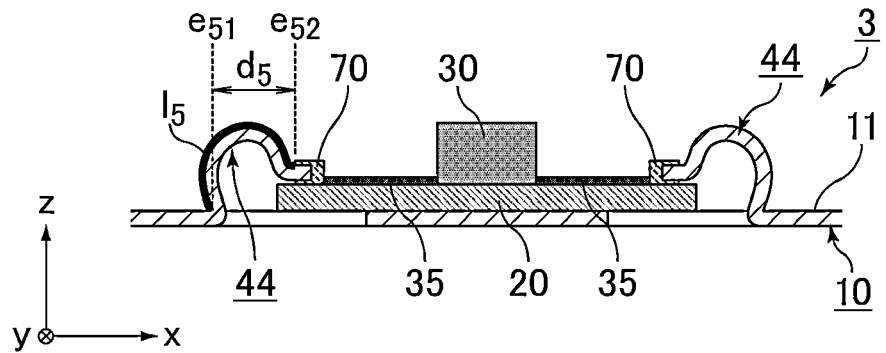
FIG. 12 is a side view in FIG. 11.

FIG. 11 is a plan view schematically illustrating an example of a stretchable mounting substrate of a third embodiment of the present invention. FIG. 12 is a side view in FIG. 11.

As illustrated in FIGS. 11 and 12, a boundary between the first substrate 10 and a connection member 44 is a position indicated by a broken line $e_{51}$, and a boundary between the connection member 44 and the connection connector 70 is a position indicated by a broken line $e_{52}$.

In a state where the first substrate 10 does not expand and contract, a length (a length $l_5$ indicated by a thick line in FIG. 12) of the connection member 44 in an expansion/contraction direction (x direction) measured along a surface of the connection member 44 is longer than a shortest length (a length indicated by the double-headed arrow $d_5$ in FIG. 12) from an end portion (a position indicated by a broken line $e_{51}$) of the first substrate 10 to an end portion (a position indicated by a broken line $e_{52}$) of the second substrate 20 to be connected by the connection member 44 when the stretchable mounting substrate 3 is viewed in the plan view, and the connection member 44 is deflected.

Therefore, in the stretchable mounting substrate 3, the force applied to the portion where the second substrate 20 and the connection member 44 are connected by the expansion and contraction of the first substrate 10 in the expansion/contraction direction (x direction) is relaxed by the change in the deflection amount of the connection member 44.

As illustrated in FIGS. 8, 9, and 10 and FIGS. 11 and 12, in the stretchable mounting substrate of the second embodiment and the third embodiment of the present invention, in a state where the first substrate does not expand and contract, preferably, the length of the connection member in the expansion/contraction direction measured along the surface of the connection member is longer than the shortest length from the end portion of the first substrate to the end portion of the second substrate to be connected by the connection member when the stretchable mounting substrate is viewed in the plan view, the connection member is deflected, and the force applied to the portion where the second substrate and the connection member are connected by the expansion and contraction of the first substrate in the expansion/contraction direction is relaxed by a change in the deflection amount of the connection member. In this case, the Young's modulus of the connection member in the expansion/contraction direction may be larger than 110% of the Young's modulus of the first substrate in the expansion/contraction direction. In this case, the connection member is preferably formed of a flexible substrate.

Fourth Embodiment

Figure 13:
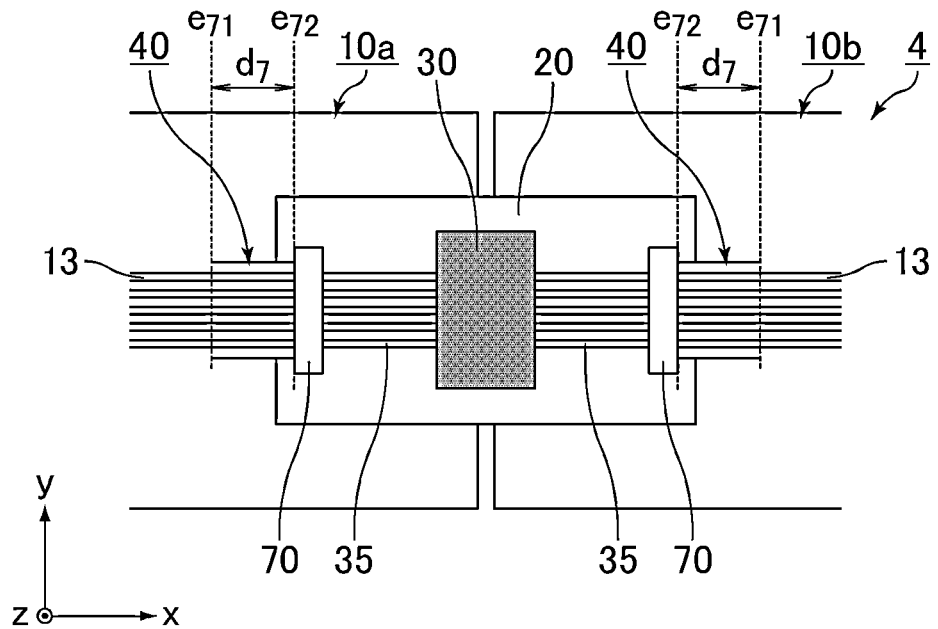
FIG. 13 is a plan view schematically illustrating an example of a stretchable mounting substrate of a fourth embodiment of the present invention.
Figure 14:
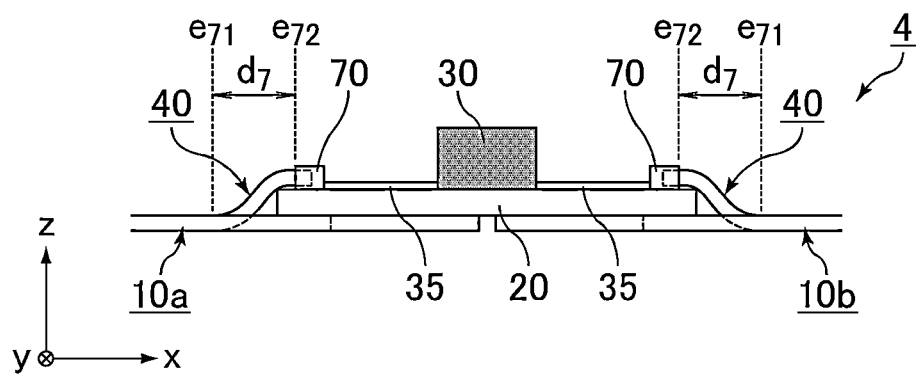
FIG. 14 is a side view in FIG. 13.

FIG. 13 is a plan view schematically illustrating an example of a stretchable mounting substrate of a fourth embodiment of the present invention. FIG. 14 is a side view in FIG. 13.

A stretchable mounting substrate 4 illustrated in FIGS. 13 and 14 includes a plurality of first substrates 10a and 10b.

The first substrate 10a and the first substrate 10b are connected to the second substrate 20 with connection members 40 interposed therebetween, respectively.

A boundary between the first substrate 10a and the connection member 40 is a position indicated by a broken line $e_{71}$, and a boundary between the connection member 40 and the connection connector 70 is a position indicated by a broken line $e_{72}$. Therefore, the length of the connection member 40 in plan view is represented by a double-headed arrow $d_7$.

That is, as shown in FIGS. 13 and 14, preferably, the stretchable mounting substrate of the fourth embodiment of the present invention includes a plurality of first substrates, and each of the plurality of first substrates is connected to the second substrate by a connection member. Since the first substrate is divided into the plurality of first substrates, stress at the time of expansion and contraction can be dispersed among the plurality of divided first substrates, so that stress applied to one first substrate is relaxed.

When a plurality of first substrates are provided as in the stretchable mounting substrate of the fourth embodiment of the present invention, a region of the first substrate overlapping the second substrate in plan view may straddle the plurality of first substrates. In such a case, after the expansion/contraction ratios of the regions of all the first substrates having the region overlapping the second substrate in plan view are obtained, the sum of the expansion/contraction ratios obtained by multiplying the area ratio of the regions (the area of the regions/the sum of the areas where the first substrates overlap the second substrate in plan view) as the contribution ratio is compared with the expansion/contraction ratio of the second substrate.

When the plurality of first substrates are provided, preferably, each of the first substrates is fixed to the second substrate at least at one place by an adhesive or the like. A place where each of the first substrates is fixed to the second substrate is not particularly limited, but preferably, each of the first substrates is fixed to the second substrate at a place farthest from a boundary with the connection member. When two first substrates are provided, only one of the first substrates may be fixed to the second substrate with an adhesive or the like, or both of the first substrates may not be fixed to the second substrate.

Figure 15:
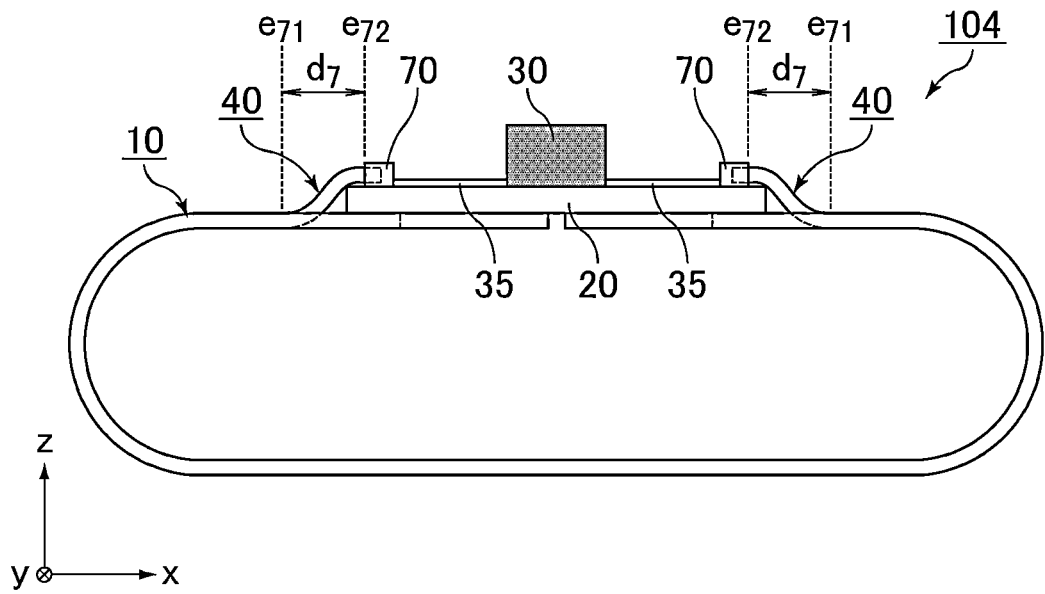
FIG. 15 is a side view schematically showing a modification of the stretchable mounting substrate of the fourth embodiment of the present invention.

FIG. 15 is a side view schematically showing a modification of the stretchable mounting substrate of the fourth embodiment of the present invention.

A stretchable mounting substrate 104 illustrated in FIG. 15 includes a first substrate 10, a second substrate 20, and connection members 40 that physically connect the first substrate 10 and the second substrate 20.

A boundary between the first substrate 10 and the connection member 40 is a position indicated by the broken line $e_{71}$, and a boundary between the connection member 40 and the connection connector 70 is a position indicated by the broken line $e_{72}$. Therefore, the length of the connection member 40 is represented by the double-headed arrow $d_7$.

The first substrate 10 has an annular shape, and both one end portion and the other end portion are in contact with the second substrate 20.

In the stretchable mounting substrate 104 illustrated in FIG. 15, since the first substrate 10 is annular, the stretchable mounting substrate 104 can be fixed to the human body by winding the first substrate 10 around the human body.

The position around which the stretchable mounting substrate 104 is wound is not particularly limited, and examples thereof include an arm, a wrist, a neck, a trunk, and a leg. The length of the first substrate 10 can be appropriately adjusted according to the position around which the human body wants to wind.

Note that the first substrates 10 may be bonded to each other immediately below the second substrate 20. In this case, it can be said that the stretchable mounting substrate is in a state where both ends of the first substrate 10 constituting the stretchable mounting substrate 1 illustrated in FIG. 1 to 5 are annularly connected.

Fourth' Embodiment

Figure 16:
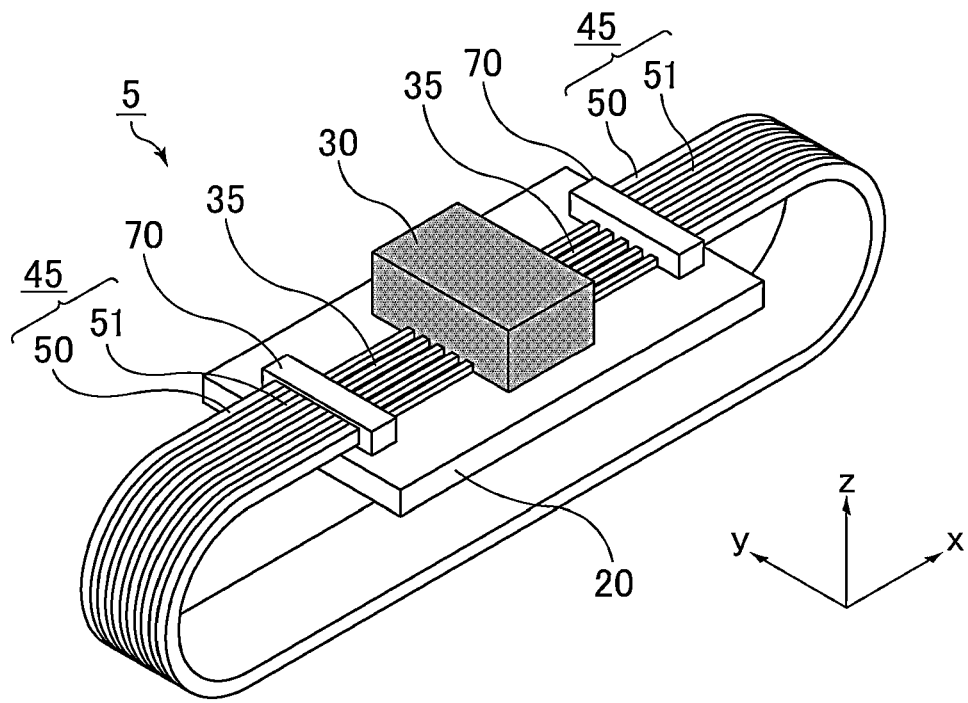
FIG. 16 is a perspective view schematically illustrating an example in which the stretchable mounting substrate of the fourth embodiment of the present invention is further modified.
Figure 17:
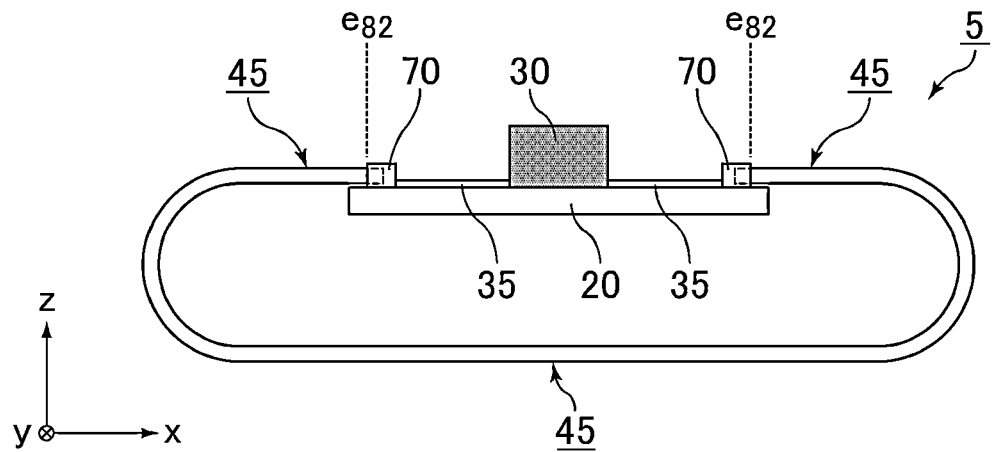
FIG. 17 is a side view in FIG. 16.

FIG. 16 is a perspective view schematically illustrating an example in which the stretchable mounting substrate of the fourth embodiment of the present invention is further modified. FIG. 17 is a side view in FIG. 16.

A stretchable mounting substrate 5 illustrated in FIG. 16 includes a second substrate 20 and connection members 45 whose both ends are physically connected to a connection connector 70 provided on the second substrate 20. The connection member 45 includes a connection base material 50 and a connection wiring 51. As illustrated in FIG. 17, a boundary between the connection member 45 and the connection connector 70 is a position indicated by a broken line $e_{82}$. That is, it can be said that the stretchable mounting substrate 5 illustrated in FIGS. 16 and 17 is the stretchable mounting substrate 4 illustrated in FIGS. 13 and 14 in which only the portion of the first substrate 10 that becomes the connection member 40 remains.

In the stretchable mounting substrate of the fourth' embodiment, the stretchable mounting substrate can be fixed to the human body by winding the connection member around the human body. The position around which the stretchable mounting substrate 5 is wound is not particularly limited, and examples thereof include an arm, a wrist, a neck, a trunk, and a leg. The length of the connection member 45 can be appropriately adjusted according to the position around which the human body wants to wind.

Fifth Embodiment

Figure 18:
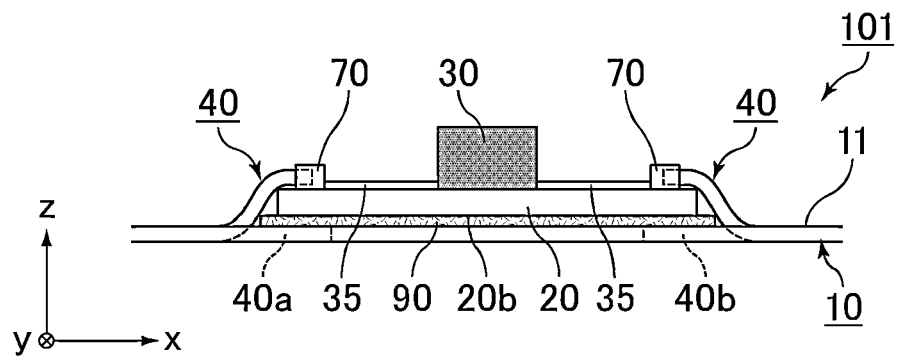
FIG. 18 is a side view schematically showing an example of a stretchable mounting substrate of a fifth embodiment of the present invention.

FIG. 18 is a side view schematically showing an example of a stretchable mounting substrate of a fifth embodiment of the present invention.

As illustrated in FIG. 18, in a stretchable mounting substrate 101, an insulating protective layer 90 is provided between the first substrate 10 and the second substrate 20. The protective layer 90 extends from an end portion of the other main surface 20b of the second substrate 20 along the lower surface of the connection member 40.

When the protective layer 90 extends from the end portion of the other main surface 20b of the second substrate 20 along the lower surface of the connection member 40, the second substrate 20 can be prevented from coming into contact with a wearer through the gaps 40a and 40b provided in the first substrate 10.

As shown in FIG. 18, in the stretchable mounting substrate of the fifth embodiment of the present invention, preferably, an electronic component is mounted only on one main surface of the second substrate, an insulating protective layer is provided on the other main surface of the second substrate which is a surface on which the electronic component is not mounted, the protective layer extends along the lower surface of the connection member from an end portion of the other main surface of the second substrate, and at least a part of the lower surface of the connection member overlaps the protective layer in plan view.

The length of the protective layer extending from the end portion of the other main surface of the second substrate along the lower surface of the connection member is not particularly limited, but preferably, the entire second substrate and the protective layer overlap each other when the stretchable mounting substrate is viewed from the thickness direction.

As the material constituting the protective layer, for example, a biocompatible material such as urethane, sponge, rubber, or cotton can be used in addition to the same material as the stretchable base material constituting the first substrate.

When the material constituting the protective layer is the same as the material constituting the stretchable base material, discomfort at the time of wearing can be reduced.

Sixth Embodiment

Figure 19:
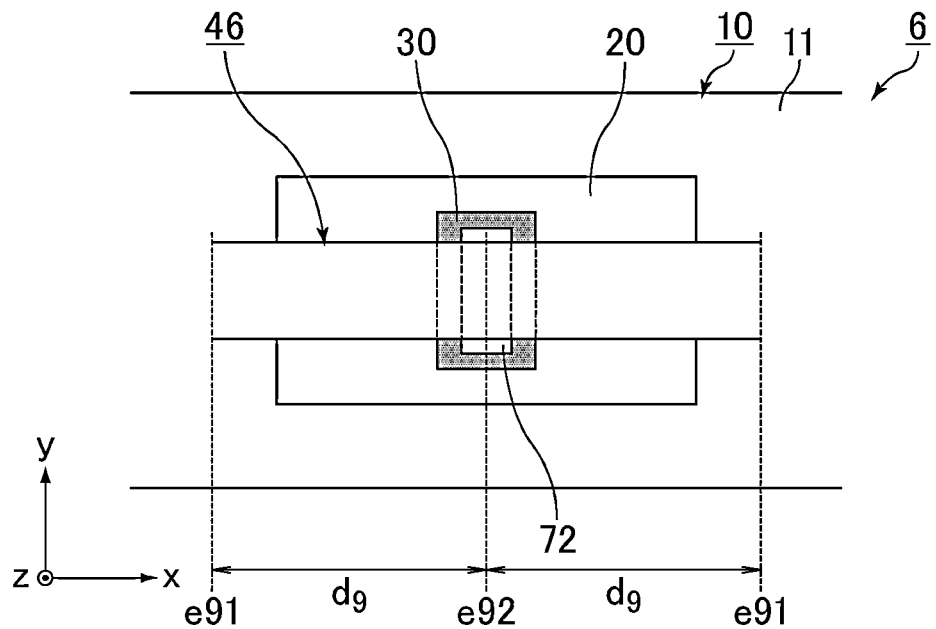
FIG. 19 is a plan view schematically illustrating an example of a stretchable mounting substrate of a sixth embodiment of the present invention.
Figure 20:
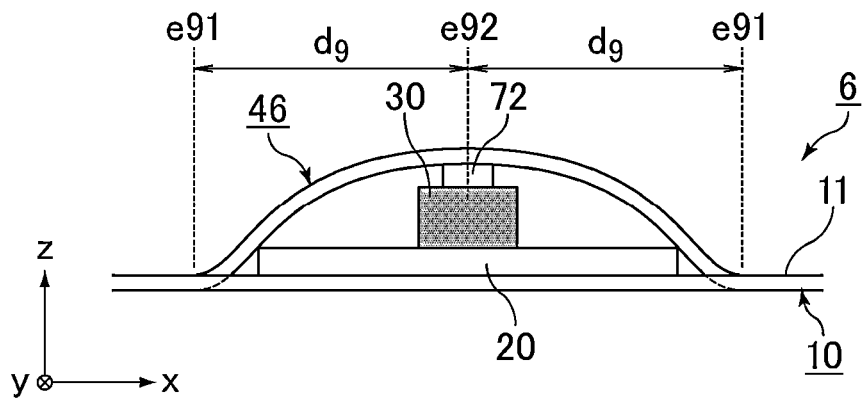
FIG. 20 is a side view in FIG. 19.

FIG. 19 is a plan view schematically illustrating an example of a stretchable mounting substrate of a sixth embodiment of the present invention. FIG. 20 is a side view in FIG. 19.

A stretchable mounting substrate 6 illustrated in FIGS. 19 and 20 includes a first substrate 10, a second substrate 20, and a connection member 46 that physically connects the first substrate 10 and the second substrate 20.

The connection member 46 has an arch shape extending over the second substrate 20 in the x direction in a side view. The connection member 46 is fitted to a connection connector 72 provided on the electronic component 30 at a central portion in the x direction. A position indicated by a broken line $e_{91}$ is a boundary between the first substrate 10 and the connection member 46.

An end portion of the connection member 46 on the second substrate 20 side is branched in a T shape from a substantially central portion of the arch shape and protrudes in the downward direction (to the second substrate 20 side), and is fitted to the connection connector 72. Therefore, a position indicated by a broken line $e_{92}$ is a boundary between the connection member 46 and the connection connector 72. Therefore, it can be said that the connection member 46 is constituted by two connection members extending from the position indicated by the broken line $e_{91}$ to the position indicated by a broken line $e_{92}$ and having a length of a double-headed arrow $d_9$ in a plan view.

At this time, a fitting portion provided in the connection connector 72 opens on the main surface of the connection connector 72 on the side opposite to the surface in contact with the electronic component 30. Therefore, it can also be said that the fitting portion opens in the upward direction (z direction).

Although not illustrated, the connection member 46 includes a connection base material and a connection wiring. Therefore, when one end portion of the connection member is fitted to the connection connector 72, a stretchable wiring of the first substrate 10 and a wiring of the second substrate 20 are electrically connected by the connection wiring.

Note that wiring not in direct contact with the second substrate 20, for example, wiring provided on the surface of an object mounted on the second substrate 20, for example, wiring provided on the surface of the electronic component 30 is also included in the wiring provided on the second substrate 20.

Seventh Embodiment

Figure 21:
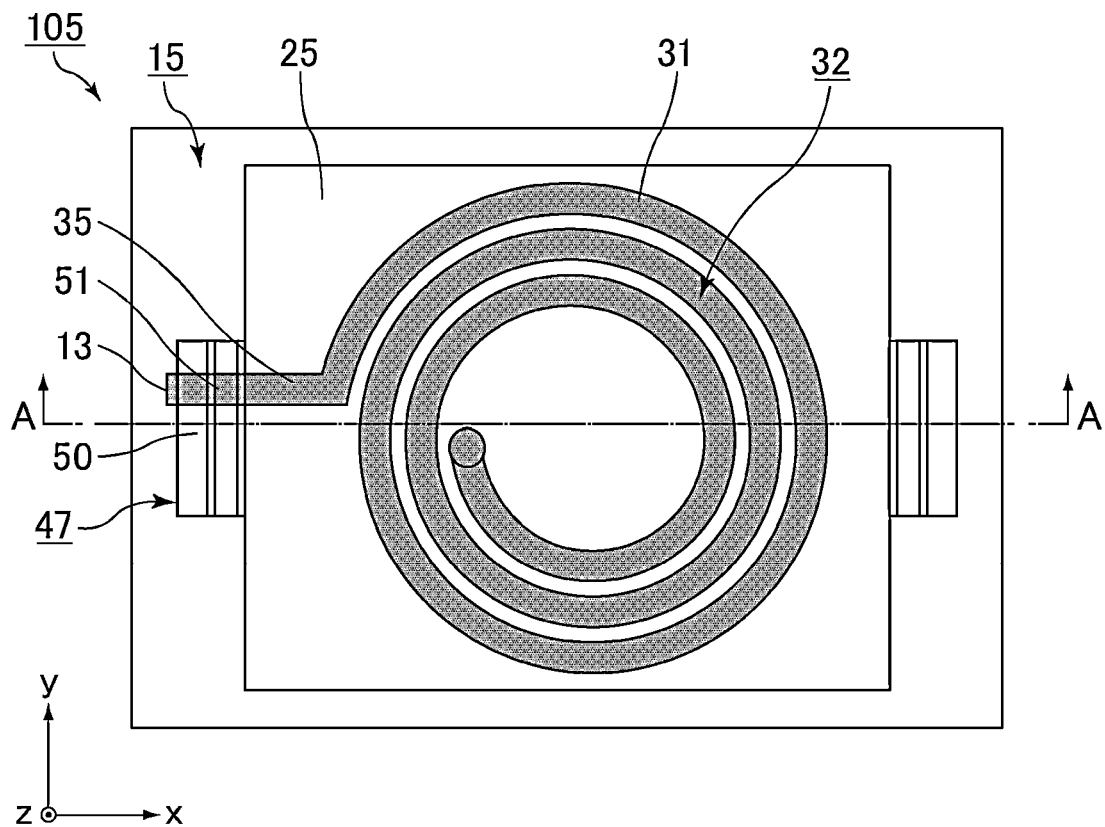
FIG. 21 is a plan view schematically illustrating an example of a stretchable mounting substrate of a seventh embodiment of the present invention.
Figure 22:
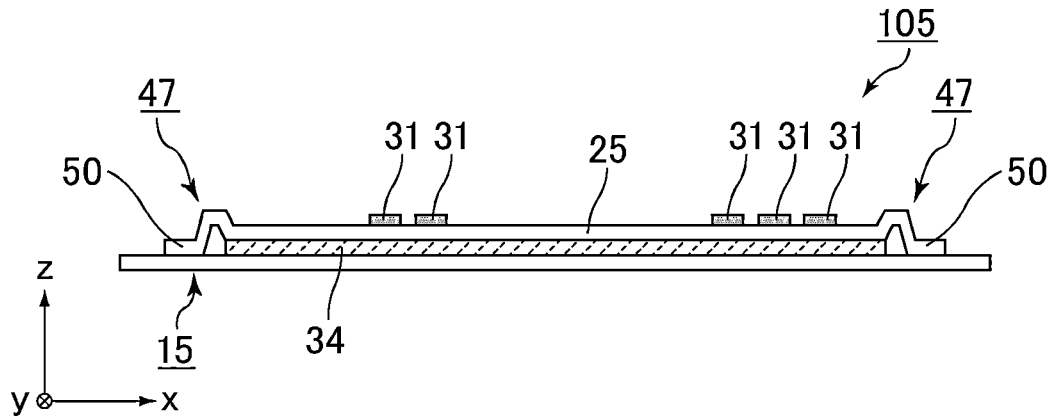
FIG. 22 is a sectional view taken along line A-A in FIG. 21.

FIG. 21 is a plan view schematically illustrating an example of a stretchable mounting substrate of a seventh embodiment of the present invention. FIG. 22 is a sectional view taken along line A-A in FIG. 21.

A stretchable mounting substrate 105 illustrated in FIGS. 21 and 22 includes a first substrate 15, a second substrate 25, and connection members 47 that physically connect the first substrate 15 and the second substrate 25.

As illustrated in FIG. 22, the connection member 47 is deflected in the x direction and has a deflection portion.

Therefore, in the stretchable mounting substrate 105, the force applied to the portion where the second substrate 25 and the connection member 47 are connected by the expansion and contraction of the first substrate 15 in the x direction is relaxed by the change in the deflection amount of the connection member 47.

In the stretchable mounting substrate of the seventh embodiment of the present invention, the material constituting the connection member and the material constituting the second substrate may be the same.

Note that the material constituting the connection member and the material constituting the second substrate being the same means that the connection base material constituting the connection member and the second substrate are the same, and the connection wiring constituting the connection member and the wiring provided on the second substrate are the same.

In the stretchable mounting substrate 105 illustrated in FIGS. 21 and 22, the connection base material 50 constituting the connection member 47 is made of the same material as the second substrate 25.

The connection wiring 51 constituting the connection member 47 is made of the same material as the wiring 35 provided on the second substrate 25.

That is, the material constituting the connection member 47 is the same as the material constituting the second substrate 25.

A coil component 32 including a coil conductor 31 is formed on the second substrate 25.

The coil conductor 31 is a part of the wiring 35 provided on the second substrate 25.

The coil component 32 and the connection wiring 51 constituting the connection member 47 are connected by the wiring 35 provided on the second substrate 25.

Note that the end portion of the coil component 32 on the side not connected to the wiring 35 may be connected to an electronic component provided on the second substrate, or may be connected to another wiring (not illustrated) disposed outside the coil conductor 31 on the second substrate in a state of being insulated from the coil conductor 31 by a cross wiring or a via conductor.

The coil conductor may be formed only on one surface of the second substrate or may be formed on both surfaces. When the coil conductors are formed on both surfaces of the second substrate, the two coil conductors may be connected by a via conductor penetrating the second substrate in the thickness direction. Therefore, for example, in the stretchable mounting substrate 105 illustrated in FIGS. 21 and 22, the end portion of the coil component 32 on the side not connected to the wiring 35 may be connected to the coil component provided on the surface of the second substrate on the opposite side (first substrate side) with a via conductor interposed therebetween.

An electronic component such as a coil component provided on the surface of the second substrate on the first substrate side may be electrically connected to the first substrate with a connection wiring provided on the surface of the connection member on the first substrate side interposed therebetween.

The connection wiring 51, the wiring 35, and the coil conductor 31 are integrally formed.

In the stretchable mounting substrate 105, the coil component 32, which is a type of electronic component, is mounted on the second substrate 25. However, the electronic component mounted on the second substrate is not limited to the coil component.

In the stretchable mounting substrate of the seventh embodiment of the present invention, the connection member and the second substrate may be integral. The state where the connection member and the second substrate are integral means a state where not only the connection base material constituting the connection member and the second substrate are integral, but also the connection wiring constituting the connection member and the wiring provided on the second substrate are integral.

In the stretchable mounting substrate 105 illustrated in FIG. 21, the connection base material 50 constituting the connection member 47 and the second substrate 25 are integral.

In addition, the connection wiring 51 constituting the connection member 47 and the wiring 35 provided on the second substrate 25 are integral.

When the connection wiring 51 constituting the connection member 47 and the wiring 35 provided on the second substrate 25 are integral, a connection connector for electrically connecting the connection wiring 51 and the wiring 35 is unnecessary.

In the stretchable mounting substrate of the seventh embodiment of the present invention, a sliding film may be disposed between the first substrate and the second substrate.

In the stretchable mounting substrate 105 illustrated in FIG. 22, a sliding film 34 is provided between the first substrate 15 and the second substrate 25.

Examples of the material constituting the sliding film 34 include a resin film having a surface subjected to a treatment for reducing a friction coefficient such as fluorine coating.

The friction coefficient generated between the sliding film and the second substrate is preferably smaller than the friction coefficient generated between the first substrate and the second substrate.

Eighth Embodiment

Figure 23:
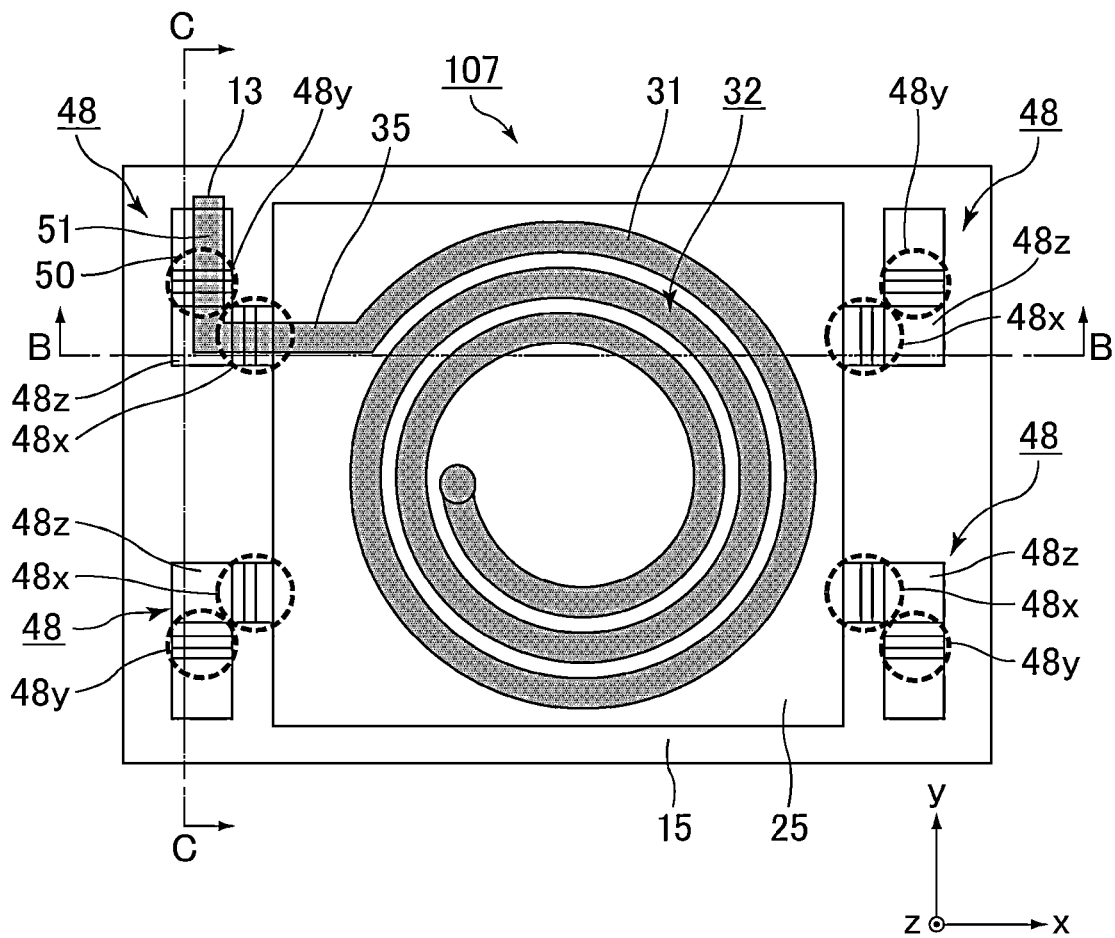
FIG. 23 is a plan view schematically illustrating an example of a stretchable mounting substrate of an eighth embodiment of the present invention.
Figure 24:
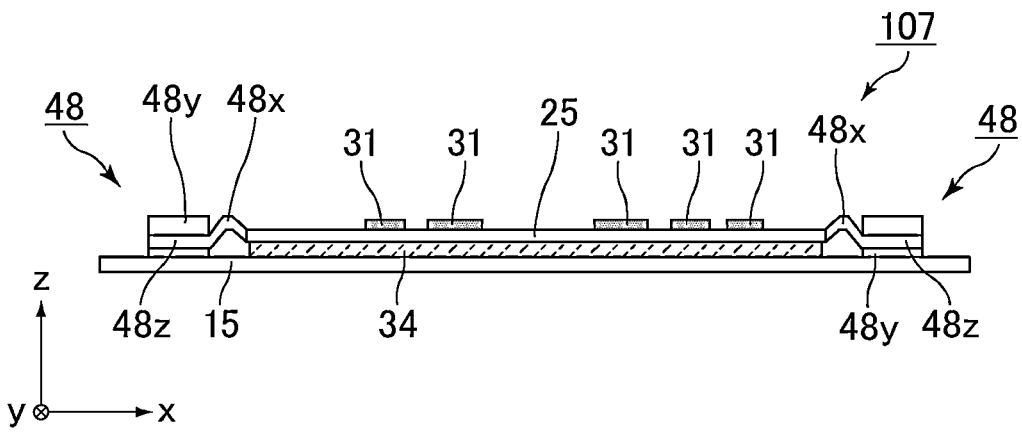
FIG. 24 is a sectional view taken along line B-B in FIG. 23.
Figure 25:
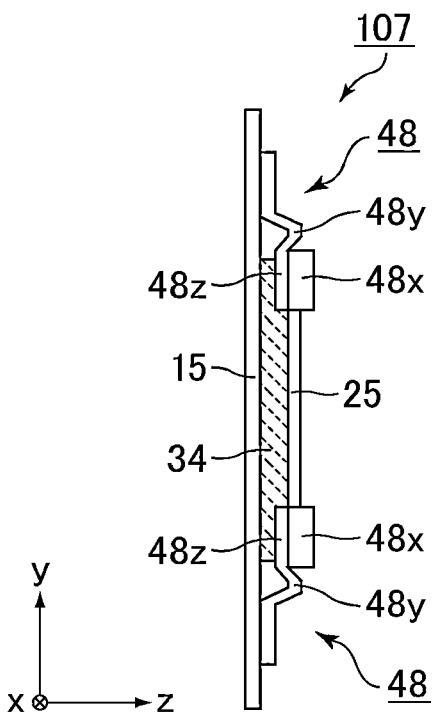
FIG. 25 is a sectional view taken along line C-C in FIG. 23.

FIG. 23 is a plan view schematically illustrating an example of a stretchable mounting substrate of an eighth embodiment of the present invention. FIG. 24 is a sectional view taken along line B-B in FIG. 23. FIG. 25 is a sectional view taken along line C-C in FIG. 23.

The stretchable mounting substrate 107 illustrated in FIGS. 23, 24, and 25 includes a first substrate 15, a second substrate 25, and connection members 48 that physically connect the first substrate 15 and the second substrate 25.

In the stretchable mounting substrate of the eighth embodiment of the present invention, the connection member may have two or more deflection portions having different expansion/contraction directions.

As illustrated in FIGS. 23, 24, and 25, the connection member 48 includes a first deflection portion 48x that deflects in the x direction and a second deflection portion 48y that deflects in the y direction.

When the connection member 48 has two or more deflection portions having different deflection directions, in a case where the first substrate 15 is expanded and contracted in an arbitrary direction, both the first deflection portion 48x and the second deflection portion 48y change the deflection amount, so that it is possible to suppress the deformation of the first substrate in the x direction and the y direction.

The deflection direction of the first deflection portion and the deflection direction of the second deflection portion may not be parallel to each other. Therefore, the deflection direction of the first deflection portion and the deflection direction of the second deflection portion may be orthogonal to each other or may not be orthogonal to each other.

The connection member having two or more deflection portions having different deflecting directions can be used not only in the eighth embodiment but also in other embodiments.

A portion in which the connection base material does not deflect in any direction (hereinafter, also referred to as an intermediate portion) may be provided between the first deflection portion and the second deflection portion.

As illustrated in FIGS. 24 and 25, in the connection member 48, an intermediate portion 48z disposed between the first deflection portion 48x and the second deflection portion 48y is not in contact with the first substrate 15. However, when the intermediate portion 48z is not bonded to the first substrate 15, the intermediate portion 48z may be in contact with the first substrate 15.

Ninth Embodiment

Figure 26:
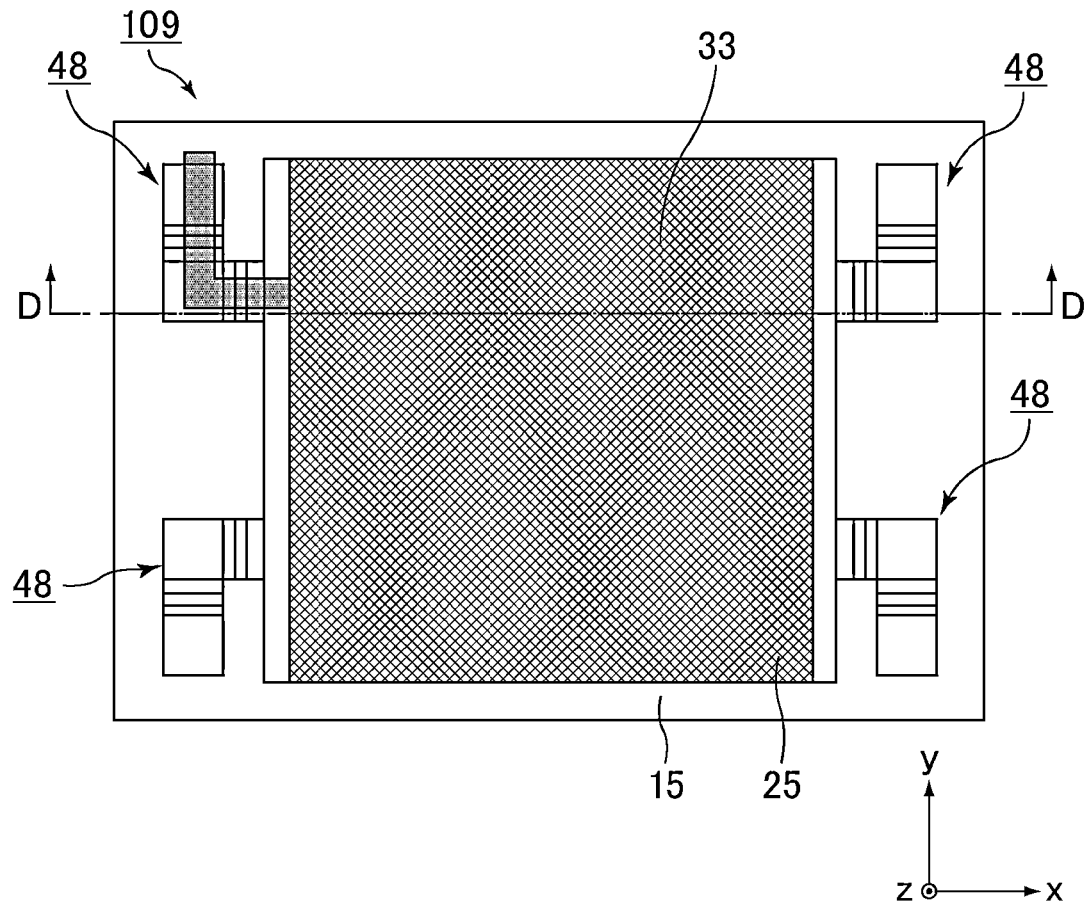
FIG. 26 is a plan view schematically illustrating an example of a stretchable mounting substrate of a ninth embodiment of the present invention.
Figure 27:
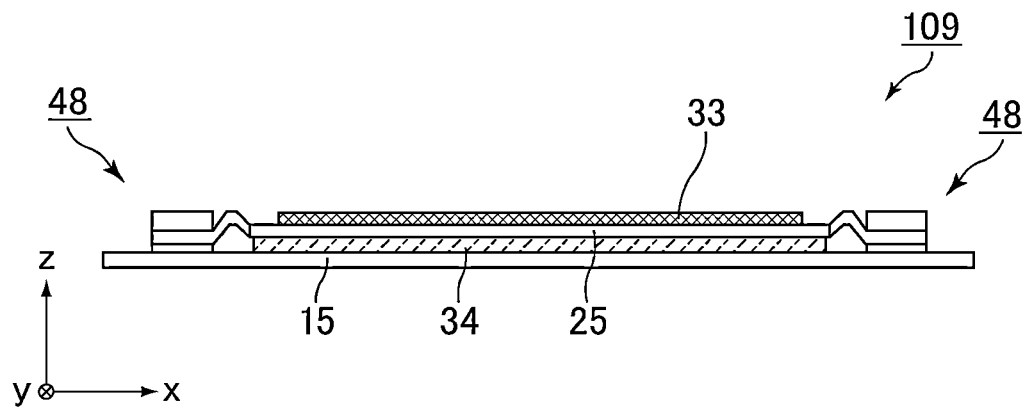
FIG. 27 is a sectional view taken along line D-D in FIG. 26.

FIG. 26 is a plan view schematically illustrating an example of a stretchable mounting substrate of a ninth embodiment of the present invention. FIG. 27 is a sectional view taken along line D-D in FIG. 26.

As illustrated in FIGS. 26 and 27, a stretchable mounting substrate 109 includes a first substrate 15, a second substrate 25, connection members 48 that connect the first substrate 15 and the second substrate 25, and a third substrate 33.

The connection member 48 is the same as the connection member described in the stretchable mounting substrate of the eighth embodiment. Therefore, the connection member 48 has a first deflection portion, a second deflection portion, and an intermediate portion.

In the stretchable mounting substrate of the ninth embodiment of the present invention, the third substrate made of a stretchable base material may be provided on the surface of the second substrate.

As illustrated in FIGS. 26 and 27, in the stretchable mounting substrate 109, the third substrate 33 made of a stretchable base material is provided on the surface of the second substrate 25.

The stretchable base material constituting the third substrate may contain a magnetic material. When the magnetic material is contained in the stretchable base material constituting the third substrate, the characteristics of the coil component can be improved when the coil component is mounted on the surface of the second substrate. The third substrate 33 is not limited to one on which components are mounted.

Tenth Embodiment

Figure 28:
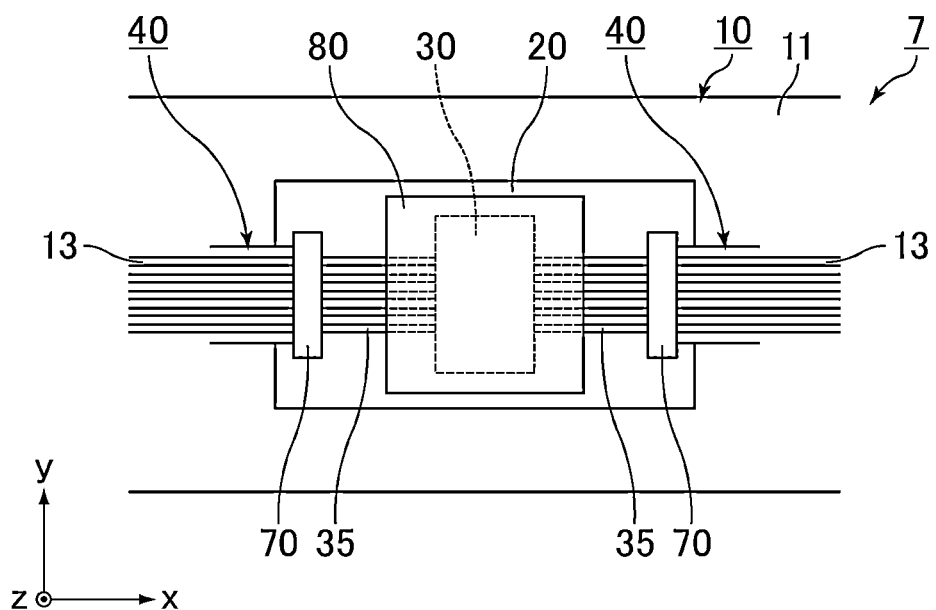
FIG. 28 is a plan view schematically illustrating an example of a stretchable mounting substrate of a tenth embodiment of the present invention.
Figure 29:
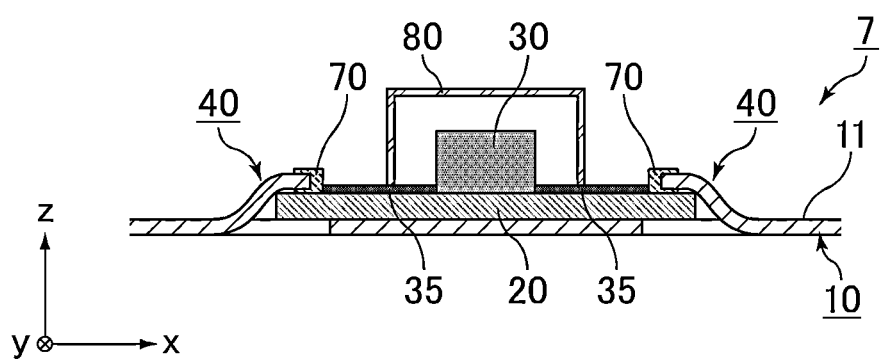
FIG. 29 is a sectional side view in FIG. 28.

FIG. 28 is a plan view schematically illustrating an example of a stretchable mounting substrate of a tenth embodiment of the present invention. FIG. 29 is a sectional side view in FIG. 28.

As illustrated in FIGS. 28 and 29, in a stretchable mounting substrate 7, the electronic component 30 mounted on the second substrate 20 is covered with a hard portion 80 (or covering). Since the electronic component 30 is covered with the hard portion 80, the electronic component 30 can be prevented from coming into contact with moisture, and water resistance and moisture resistance can be improved. As shown in FIG. 28, the hard portion 80 does not overlap the connection member 40 in plan view.

Figure 30:
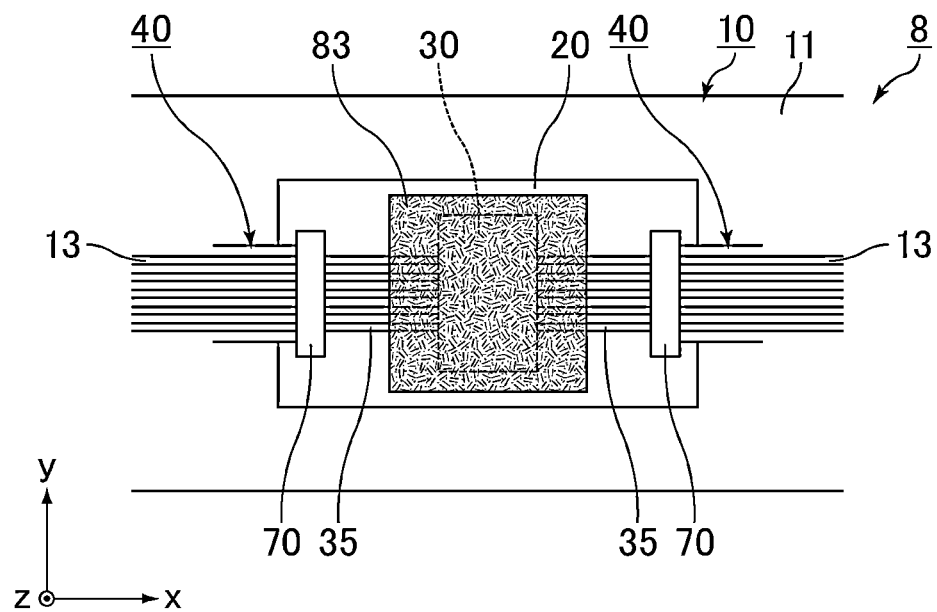
FIG. 30 is a plan view schematically illustrating another example of a stretchable mounting substrate of a tenth embodiment of the present invention.
Figure 31:
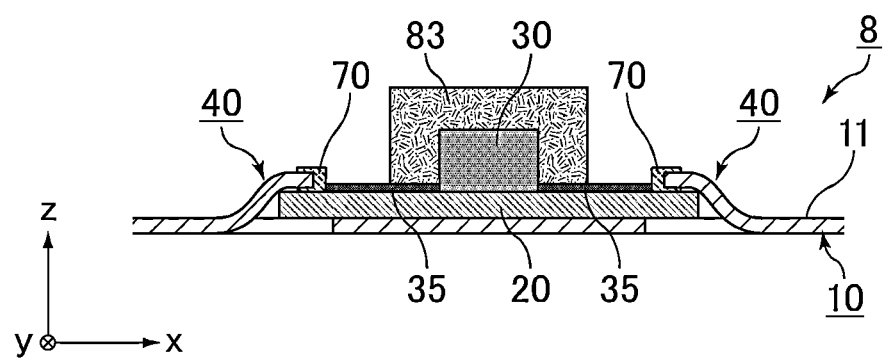
FIG. 31 is a sectional side view in FIG. 30.

FIG. 30 is a plan view schematically showing another example of the stretchable mounting substrate of the tenth embodiment of the present invention. FIG. 31 is a sectional side view in FIG. 30.

As illustrated in FIGS. 30 and 31, in a stretchable mounting substrate 8, the electronic component 30 mounted on the second substrate 20 is covered with a sealing resin 83. Since the sealing resin 83 can block moisture by covering the electronic component 30, it corresponds to the hard portion 80 of the stretchable mounting substrate 7 described with reference to FIGS. 28 and 29.

As shown in FIGS. 28 and 29 and FIGS. 30 and 31, in the stretchable mounting substrate of the tenth embodiment of the present invention, preferably, the hard portion that covers at least a part of the electronic component and blocks moisture is provided on the surface of the second substrate.

In FIGS. 28 and 29, the connection connector 70 provided on the second substrate 20 is not covered with the hard portion 80, but in the stretchable mounting substrate of the present invention, the hard portion 80 may cover a configuration other than the electronic component 30 provided on the second substrate 20, for example, the connection connector 70.

In addition, for example, the plan view shape of the hard portion 80 may be substantially the same as the plan view shape of the second substrate 20, and the entire surface of the second substrate 20 on which the electronic component 30 is mounted may be covered with the hard portion.

In FIGS. 30 and 31, the connection connector 70 provided on the second substrate 20 is not covered with the sealing resin 83, but in the stretchable mounting substrate of the present invention, the sealing resin 83 may cover a configuration other than the electronic component 30 provided on the second substrate 20, for example, the connection connector 70.

Examples of the material constituting the hard portion include resins such as a silicone-based resin, an acrylic resin, an olefin-based resin, a urethane-based resin, and an elastomer-based resin.

Eleventh Embodiment

Figure 32:
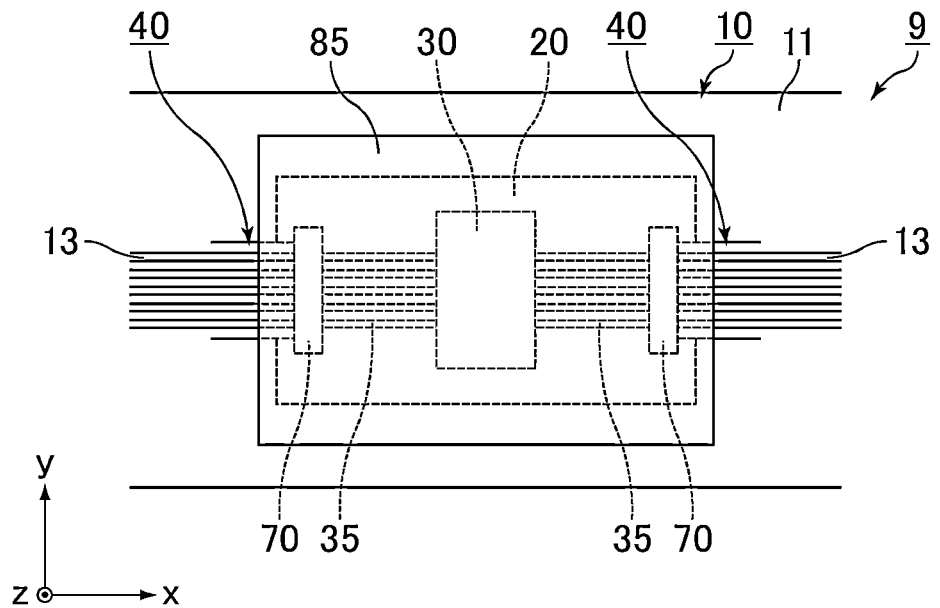
FIG. 32 is a plan view schematically illustrating an example of a stretchable mounting substrate of an eleventh embodiment of the present invention.
Figure 33:
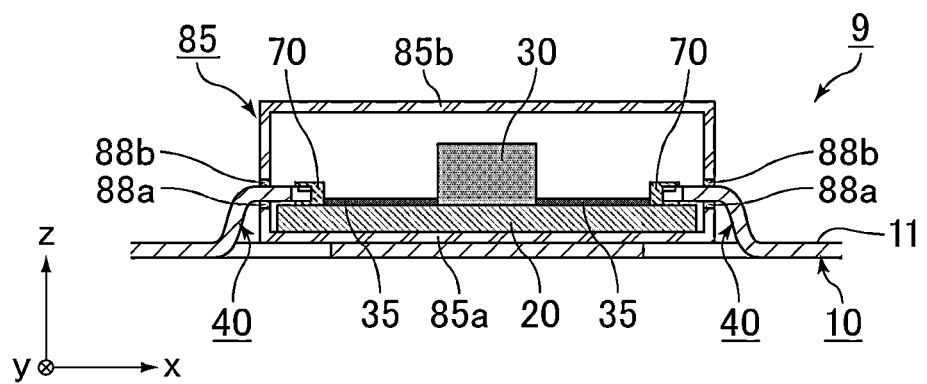
FIG. 33 is a sectional side view in FIG. 32.
Figure 34:
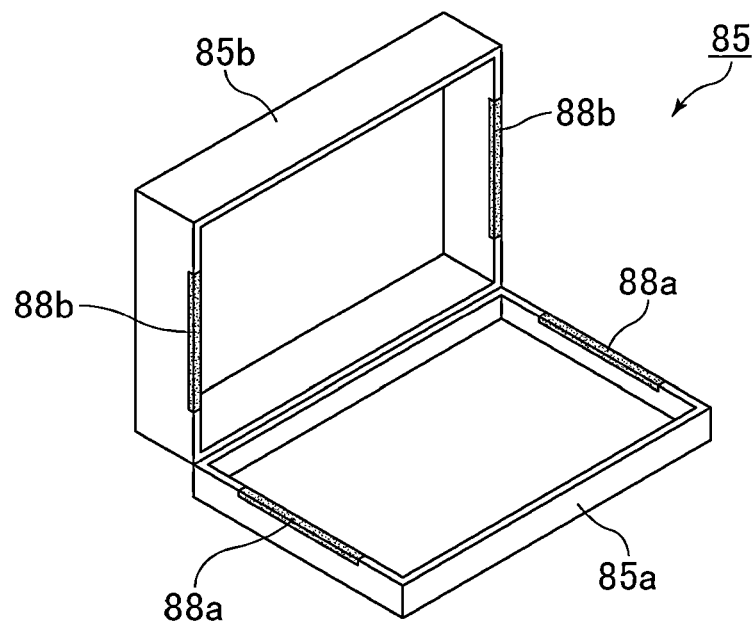
FIG. 34 is a perspective view schematically illustrating a waterproof case used in FIGS. 32 and 33.

FIG. 32 is a plan view schematically illustrating an example of a stretchable mounting substrate of an eleventh embodiment of the present invention. FIG. 33 is a sectional side view in FIG. 32. FIG. 34 is a perspective view schematically illustrating an example of a waterproof case used in FIGS. 32 and 33.

As illustrated in FIG. 32, in a stretchable mounting substrate 9, the entire second substrate 20 is housed in a waterproof case 85. As illustrated in FIG. 34, the waterproof case 85 includes a bottom portion 85a and a lid portion 85b that is openable and closable relative to the bottom portion 85a, and which together define a housing portion capable of housing the second substrate.

Sealing portions 88a and 88b extending in a part of the contact surface are provided on the contact surface between the bottom portion 85a and the lid portion 85b of the waterproof case 85.

As illustrated in FIG. 33, in a state where the waterproof case 85 is closed, the connection member 40 is sandwiched between the sealing portions 88a and 88b. Since the connection member 40 is sandwiched between the sealing portions 88a and 88b, it is possible to prevent moisture from entering the inside of the waterproof case 85.

Therefore, in the stretchable mounting substrate of the eleventh embodiment of the present invention, preferably, the stretchable mounting substrate further includes the waterproof case, the waterproof case includes the bottom portion and the openable/closable lid portion which together define the housing portion capable of housing the second substrate, the entire second substrate being housed in the housing portion, the sealing portions extending in at least a part of the contact surface between the bottom portion and the lid portion are provided on the contact surface, and the connection member is sandwiched between the sealing portions in a state where the waterproof case is closed.

In the stretchable mounting substrate of the eleventh embodiment of the present invention, the sealing portion may be formed on the entire contact surface between the bottom portion and the lid portion.

In the stretchable mounting substrate of the eleventh embodiment of the present invention, the housing portion of the waterproof case is preferably provided with an interlocking mechanism for interlocking the closing/opening of the waterproof case and the fitting/non-fitting between the connection connector and the connection member.

Examples of the interlocking mechanism include a fixing portion that is provided on the lid portion of the waterproof case and fixes the end of the connection member toward the bottom portion. The second substrate on which the connection connector with the fitting portion opened on the upper side is mounted is housed in the waterproof case having the fixing portion, and the position of the connection connector is adjusted such that the position of the end of the connection member when the waterproof case is closed becomes the position of the fitting portion of the connection connector. By performing the position adjustment as described above, the connection member is fitted to the fitting portion of the connection connector by closing the waterproof case. In addition, by opening the waterproof case, the end of the connection member fixed by the fixing portion moves in a direction away from the connection connector, and the fitting state between the connection member and the connection connector is released.

The stretchable mounting substrate of the present invention can be manufactured, for example, by connecting the first substrate and the second substrate with the connection member. At this time, a part of the first substrate may be cut out and used as a connection member.

DESCRIPTION OF REFERENCE SYMBOLS 1, 2, 3, 4, 5, 6, 7, 8, 9, 101, 104, 105, 107, 109: Stretchable mounting substrate
10, 10a, 10b, 15: First substrate
11: Stretchable base material
13: Stretchable wiring
20, 25: Second substrate
20b: Other main surface of second substrate
30: Electronic component
31: Coil conductor
32: Coil component
33: Third substrate
34: Sliding film
35: Wiring provided on second substrate
40, 42, 44, 45, 46, 47, 48: Connection member
40a, 40b: Gap generated by cutting out connection member from first substrate
48x: First deflection portion
48y: Second deflection portion
48z: Intermediate portion
50: Connection base material
51: Connection wiring
60: Auxiliary material
65: Electrode on auxiliary material side
70, 72: Connection connector
70a: Fitting portion of connection connector
80: Hard portion
83: Sealing resin (hard portion)
85: Waterproof case
85a: Bottom portion of waterproof case
85b: Lid portion of waterproof case
88a, 88b: Sealing portion
90: Protective layer
$d_1, d_3, d_5, d_7, d_9$: Shortest length from end portion of first substrate to end portion of second substrate to be connected by connection member when stretchable mounting substrate is viewed in the plan view in state where first substrate does not expand and contract
$d_2, d_4$: Shortest length from end portion of first substrate to end portion of second substrate to be connected by connection member when stretchable mounting substrate is viewed in the plan view in state where first substrate is extended
$e_{11}, e_{31}, e_{51}, e_{71}, e_{91}$: Boundary between first substrate and connection member
$e_{12}, e_{32}, e_{52}, e_{72}, e_{82}, e_{92}$: Boundary between connection member and connection connector
$l_1, l_2, l_3, l_4$: Length of connection member in expansion/contraction direction measured along surface of connection member $t_1$: Thickness of end of connection member
$t_{11}$: Thickness of connection member itself
$t_{12}$: Thickness of auxiliary material
$t_2$: Thickness of fitting portion of connection connector

The invention claimed is:

1. A stretchable mounting substrate comprising:
a first substrate including a stretchable base material and a stretchable wiring on the stretchable base material;
a second substrate including a wiring for an electronic component, the second substrate overlapping at least a part of the first substrate in a plan view of the stretchable mounting substrate; and
a connection member connecting the first substrate and the second substrate, the connection member including:
a connection base material; and
a connection wiring electrically connecting the stretchable wiring of the first substrate and the wiring of the second substrate, and
wherein, the connection member is configured to be deformed in accordance with an expansion/contraction direction of the first substrate so that an expansion/contraction ratio of a region of the first substrate overlapping the second substrate in the plan view is larger than an expansion/contraction ratio of the second substrate.

2. The stretchable mounting substrate according to claim 1, wherein the stretchable mounting substrate includes a plurality of the connection members and the second substrate is connected to the plurality of the connection members.

3. The stretchable mounting substrate according to claim 2, wherein the first substrate is a plurality of first substrates, and each of the plurality of first substrates is connected to the second substrate by a respective connection member of the plurality of the connection members.

4. The stretchable mounting substrate according to claim 1, wherein a Young's modulus of the connection member in the expansion/contraction direction is 110% or less of a Young's modulus of the first substrate in the expansion/contraction direction.

5. The stretchable mounting substrate according to claim 4, wherein, in a state where the first substrate is not expanded or contracted, a length of the connection member in the expansion/contraction direction measured along a surface of the connection member is substantially the same as a shortest length from an end portion of the first substrate to an end portion of the second substrate connected by the connection member when the stretchable mounting substrate is viewed in the plan view.

6. The stretchable mounting substrate according to claim 1, wherein, in a state where the first substrate is not expanded or contracted, a length of the connection member in the expansion/contraction direction measured along a surface of the connection member is longer than a shortest length from an end portion of the first substrate to an end portion of the second substrate connected by the connection member when the stretchable mounting substrate is viewed in the plan view.

7. The stretchable mounting substrate according to claim 6, wherein a Young's modulus of the connection member in the expansion/contraction direction is larger than 110% of a Young's modulus of the first substrate in the expansion/contraction direction.

8. The stretchable mounting substrate according to claim 6, wherein the connection member is a flexible substrate.

9. The stretchable mounting substrate according to claim 1, wherein a material comprising the connection member and a material comprising the first substrate are the same.

10. The stretchable mounting substrate according to claim 9, wherein the connection member is integral with the first substrate.

11. The stretchable mounting substrate according to claim 10, wherein the connection member does not overlap the first substrate in the plan view.

12. The stretchable mounting substrate according to claim 10, further comprising:
an electronic component mounted only on a first main surface of the second substrate; and
an insulating protective layer on a second main surface of the second substrate which is a surface on which the electronic component is not mounted,
wherein the insulating protective layer extends from an end portion of the second main surface of the second substrate along a surface of the connection member, and
wherein at least a part of the surface of the connection member overlaps the insulating protective layer in the plan view.

13. The stretchable mounting substrate according to claim 1,
wherein the second substrate further includes a connection connector connected to the wiring of the second substrate, and
wherein a first end of the connection wiring of the connection member is electrically connected to the wiring of the second substrate via the connection connector.

14. The stretchable mounting substrate according to claim 13, wherein the connection connector is a flexible cable connector.

15. The stretchable mounting substrate according to claim 13,
wherein a thickness of the connection member is smaller than a fitting thickness of the connection connector, and
the stretchable mounting substrate further includes an auxiliary material on a first main surface of an end of the connection member in a thickness direction thereof, the auxiliary material having a thickness such that a combined thickness of the connection member and the auxiliary material substantially the same as the fitting thickness of the connection connector.

16. The stretchable mounting substrate according to claim 15, wherein the auxiliary material is a glass epoxy substrate.

17. The stretchable mounting substrate according to claim 1, further comprising:
an electronic component on the second substrate; and
a covering that covers at least a part of the electronic component.

18. The stretchable mounting substrate according to claim 17, wherein the covering does not overlap the connection member in plan view.

19. The stretchable mounting substrate according to claim 1, further comprising:
a waterproof case that houses an entirety of the second substrate, wherein the waterproof case includes a bottom portion and a lid portion that is openable and closable relative to the bottom portion; and
sealing portions that extend along at least a part of a contact surface between the bottom portion and the lid portion, and
wherein the connection member is sandwiched between the sealing portions in a state where the waterproof case is in a closed position.

20. The stretchable mounting substrate according to claim 19, wherein the housing portion further includes an interlocking mechanism for locking and unlocking of the waterproof.

* * * * *